United States Patent
Asenov

(10) Patent No.: US 11,049,939 B2
(45) Date of Patent: Jun. 29, 2021

(54) REDUCED LOCAL THRESHOLD VOLTAGE VARIATION MOSFET USING MULTIPLE LAYERS OF EPI FOR IMPROVED DEVICE OPERATION

(71) Applicant: SemiWise Limited, Scotland (GB)

(72) Inventor: Asen Asenov, Scotland (GB)

(73) Assignee: SemiWise Limited, Glasgow (GB)

( * ) Notice: Subject to any disclaimer, the term of this patent is extended or adjusted under 35 U.S.C. 154(b) by 0 days.

(21) Appl. No.: 15/226,118

(22) Filed: Aug. 2, 2016

(65) Prior Publication Data

US 2017/0040449 A1 Feb. 9, 2017

Related U.S. Application Data

(60) Provisional application No. 62/200,533, filed on Aug. 3, 2015.

(51) Int. Cl.
*H01L 29/10* (2006.01)
*H01L 29/66* (2006.01)
(Continued)

(52) U.S. Cl.
CPC ...... *H01L 29/105* (2013.01); *H01L 29/41775* (2013.01); *H01L 29/41783* (2013.01);
(Continued)

(58) Field of Classification Search
CPC .......... H01L 29/7833; H01L 29/41775; H01L 29/41783; H01L 29/66545; H01L 29/6656;
(Continued)

(56) References Cited

U.S. PATENT DOCUMENTS

| 5,298,452 A | 3/1994 | Meyerson |
| 5,314,547 A | 5/1994 | Heremans et al. |

(Continued)

FOREIGN PATENT DOCUMENTS

| EP | 0936676 | 8/1999 |
| WO | WO-2009/053327 | 4/2009 |
| WO | WO-2013/027092 | 2/2013 |

OTHER PUBLICATIONS

"Dielectric breakdown I: a review of oxide breakdown" Verweijl, J. F.; Klootwijk, J. H.. Microelectronics Journal 27.7: 611-22. Elsevier. Oct. 1996.*

(Continued)

*Primary Examiner* — Shih Tsun A Chou
(74) *Attorney, Agent, or Firm* — Womble Bond Dickinson (US) LLC

(57) ABSTRACT

A device structure with multiple layers of low temperature epitaxy is disclosed that eliminates source and drain and extension implants, providing a planar interface with abrupt junctions between epitaxial extensions and substrate, mitigating electrostatic coupling between transistor drain and transistor channel and reducing short channel effects. The reduction of channel doping results in improved device performance from reduced impurity scattering and reduction of random dopant induced threshold voltage variations (sigma-Vt). Avoiding implants further reduces device sigma-Vt due to random dopants' diffusion from source and drain extensions, which creates device channel length variations during thermal activation anneal of implanted dopants. The defined transistor structure employs at least two levels of low-temperature epitaxy, and creates a planar interface with various types of transistor substrates resulting in performance improvement. Mixed epitaxial layer growth materials inducing tensile or compressive gate stresses can be
(Continued)

advantageously used with the invention to further improve device characteristics.

15 Claims, 12 Drawing Sheets

(51) Int. Cl.
    *H01L 29/417*     (2006.01)
    *H01L 29/78*     (2006.01)
    *H01L 29/165*     (2006.01)

(52) U.S. Cl.
    CPC .... *H01L 29/6656* (2013.01); *H01L 29/66545* (2013.01); *H01L 29/66628* (2013.01); *H01L 29/7834* (2013.01); *H01L 29/165* (2013.01); *H01L 29/665* (2013.01); *H01L 29/7848* (2013.01)

(58) Field of Classification Search
    CPC ..... H01L 21/823418; H01L 21/823814; H01L 29/105
    See application file for complete search history.

(56) References Cited

U.S. PATENT DOCUMENTS

| | | |
|---|---|---|
| 5,316,958 A | 5/1994 | Meyerson |
| 5,710,450 A * | 1/1998 | Chau ............... H01L 21/2254 257/19 |
| 6,124,627 A * | 9/2000 | Rodder ............ H01L 21/28114 257/616 |
| 6,180,978 B1 | 1/2001 | Chatterjee et al. |
| 6,188,114 B1 * | 2/2001 | Gardner ........... H01L 29/41775 257/344 |
| 6,254,676 B1 * | 7/2001 | Yang ................ H01L 21/28035 117/94 |
| 6,479,866 B1 | 11/2002 | Xiang |
| 6,566,734 B2 | 5/2003 | Sugihara et al. |
| 6,627,488 B2 | 9/2003 | Lee |
| 6,627,502 B1 * | 9/2003 | Cho .................... H01L 21/2257 257/E21.151 |
| 6,630,710 B1 | 10/2003 | Augusto |
| 6,667,200 B2 | 12/2003 | Sohn et al. |
| 6,746,924 B1 * | 6/2004 | Lee ................. H01L 21/26586 257/E21.345 |
| 6,812,157 B1 | 11/2004 | Gadgil |
| 7,023,068 B1 | 4/2006 | Hopper et al. |
| 7,045,407 B2 | 5/2006 | Keating et al. |
| 7,227,224 B2 | 6/2007 | Ko et al. |
| 7,459,752 B2 | 12/2008 | Doris et al. |
| 7,569,456 B2 | 8/2009 | Ko et al. |
| 7,589,347 B2 | 9/2009 | Nash et al. |
| 7,732,285 B2 | 6/2010 | Sell et al. |
| 7,906,413 B2 | 3/2011 | Cardone et al. |
| 8,012,820 B2 | 9/2011 | Majumdar et al. |
| 8,273,617 B2 | 9/2012 | Thompson et al. |
| 8,313,999 B2 | 11/2012 | Cappellani et al. |
| 8,450,165 B2 | 5/2013 | Bohr |
| 8,486,778 B2 | 7/2013 | Haran et al. |
| 8,614,486 B2 | 12/2013 | Haran et al. |
| 8,748,986 B1 | 6/2014 | Shifren et al. |
| 8,847,315 B2 * | 9/2014 | Yang .................. H01L 27/1211 257/347 |
| 9,397,003 B1 * | 7/2016 | Niimi .............. H01L 21/823418 |
| 2001/0009292 A1 | 7/2001 | Nishinohara et al. |
| 2002/0001930 A1 | 1/2002 | Lee |
| 2002/0028546 A1 * | 3/2002 | Shin ................. H01L 29/41775 438/197 |
| 2002/0029372 A1 | 3/2002 | Lee |
| 2002/0037619 A1 | 3/2002 | Sugihara et al. |
| 2003/0211681 A1 | 11/2003 | Hanafi et al. |
| 2003/0214000 A1 * | 11/2003 | Jang ................ H01L 21/28247 257/384 |
| 2004/0080003 A1 * | 4/2004 | Lee .................. H01L 29/41775 257/413 |
| 2004/0169221 A1 * | 9/2004 | Ko .................... H01L 29/66545 257/330 |
| 2004/0201063 A1 | 10/2004 | Fukuda |
| 2004/0206980 A1 | 10/2004 | Cheong et al. |
| 2005/0095796 A1 * | 5/2005 | van Bentum ......... H01L 29/665 438/300 |
| 2006/0022270 A1 | 2/2006 | Boyd et al. |
| 2006/0046399 A1 | 3/2006 | Lindert et al. |
| 2006/0113605 A1 | 6/2006 | Currie |
| 2006/0157797 A1 * | 7/2006 | Tateshita ........... H01L 21/28114 257/369 |
| 2007/0049022 A1 * | 3/2007 | Chen ................ H01L 21/26513 438/682 |
| 2007/0166926 A1 | 7/2007 | Ko et al. |
| 2008/0001237 A1 | 1/2008 | Chang et al. |
| 2008/0017887 A1 | 1/2008 | Nagata et al. |
| 2008/0242037 A1 | 10/2008 | Sell et al. |
| 2008/0283906 A1 | 11/2008 | Bohr |
| 2009/0050984 A1 * | 2/2009 | Balasubramanian ........................ H01L 21/28518 257/412 |
| 2009/0321820 A1 | 12/2009 | Yamakawa |
| 2009/0321849 A1 | 12/2009 | Miyamura et al. |
| 2010/0237433 A1 | 9/2010 | Zampardi et al. |
| 2011/0073961 A1 | 3/2011 | Dennard et al. |
| 2011/0074498 A1 * | 3/2011 | Thompson ...... H01L 21/823412 327/543 |
| 2011/0147842 A1 | 6/2011 | Cappellani et al. |
| 2011/0165739 A1 * | 7/2011 | Majumdar .......... H01L 29/7848 438/154 |
| 2011/0212583 A1 | 9/2011 | Neudeck |
| 2011/0230017 A1 * | 9/2011 | Khater ............... H01L 29/7839 438/151 |
| 2011/0233688 A1 * | 9/2011 | Ren .......................... H01L 21/84 257/408 |
| 2011/0260220 A1 | 10/2011 | Chi et al. |
| 2012/0058610 A1 | 3/2012 | Ookoshi et al. |
| 2012/0061759 A1 * | 3/2012 | Cheng .............. H01L 29/66628 257/347 |
| 2012/0104470 A1 * | 5/2012 | Ponoth ............. H01L 29/66545 257/288 |
| 2012/0205728 A1 * | 8/2012 | Yin .................... H01L 29/66545 257/288 |
| 2013/0001706 A1 | 1/2013 | Haran et al. |
| 2013/0015509 A1 | 1/2013 | Haran et al. |
| 2013/0015512 A1 | 1/2013 | Haran et al. |
| 2013/0015525 A1 * | 1/2013 | Cheng .............. H01L 21/823814 257/351 |
| 2013/0032859 A1 * | 2/2013 | Pei ...................... H01L 29/6656 257/192 |
| 2013/0032876 A1 * | 2/2013 | Cheng ............... H01L 29/66545 257/327 |
| 2013/0168776 A1 * | 7/2013 | Liang ................. H01L 21/76224 257/369 |
| 2013/0249021 A1 * | 9/2013 | Asenov .................. H01L 29/517 257/410 |
| 2014/0070333 A1 * | 3/2014 | Cheng .............. H01L 21/28079 257/411 |
| 2014/0159124 A1 * | 6/2014 | Doris .................. H01L 29/6653 257/288 |
| 2014/0264612 A1 * | 9/2014 | Cheng .............. H01L 21/02636 257/368 |
| 2014/0264632 A1 * | 9/2014 | Richter ............. H01L 29/66795 257/401 |
| 2014/0299919 A1 | 10/2014 | Yin et al. |
| 2014/0339638 A1 * | 11/2014 | Cheng ................. H01L 27/1203 257/347 |
| 2014/0353717 A1 * | 12/2014 | Loubet ................. H01L 27/092 257/192 |
| 2015/0087120 A1 | 3/2015 | Adam et al. |
| 2015/0108576 A1 * | 4/2015 | Barge ....................... H01L 21/84 257/351 |
| 2015/0115374 A1 | 4/2015 | Yin et al. |
| 2015/0194505 A1 | 7/2015 | Asenov et al. |
| 2015/0236117 A1 | 8/2015 | Kapoor et al. |

(56) References Cited

U.S. PATENT DOCUMENTS

| | | | | |
|---|---|---|---|---|
| 2015/0270343 | A1* | 9/2015 | Cheng | H01L 27/0922 257/192 |
| 2015/0372102 | A1* | 12/2015 | Usami | H01L 29/41775 257/327 |
| 2016/0035843 | A1* | 2/2016 | Vinet | H01L 21/84 438/154 |
| 2016/0148933 | A1* | 5/2016 | Cheng | H01L 21/02532 257/369 |
| 2016/0343856 | A1* | 11/2016 | Leobandung | H01L 23/535 |

OTHER PUBLICATIONS

Sze, et al. Physics of Semiconductor Devices, John Wiley & Sons, Inc., 2007, pp. 30-32, 343-344.*

Sze et al., Physics of Semiconductor Devices, John Wiley & Sons, Inc. 2007, pp. 28-32, 312-313 (Year: 2007).*

Young, Short-Channel Effect in Fully Depleted SOI MOSFET's, IEEE Transactions on Electron Devices, vol. 36. No. 2. Feb. 1989, pp. 399-402 (Year: 1989).*

Aoki, M , et al., "0.1 µm CMOS Devices Using Low-Impurity-Channel Transistors (LICT)", International Electron Devices Meeting, 1990. IEDM '90 Technical Digest, (Dec. 9-12, 1990), pp. 9.8.1 to 9.8.3.

Asenov, Asen , "Random Dopant Induced Threshold Voltage Lowering and Fluctuations in Sub-0.1 µm MOSFET's: A 3-D "Atomistic" Simulation Study", IEEE Transactions on Electron Devices, vol. 45, No. 12, (Dec. 1998), pp. 2505-2513.

Asenov, Asen , "Random Dopant Threshold Voltage Fluctuations in 50nm Epitaxial Channel MOSFETs: A 3D 'Atomistic' Simulation Study", ESSDERC '98: 28th Conference on European Solid-State Devices, Bordeax, France, (Sep. 8-10. 1998), pp. 300-303.

Asenov, Asen , et al., "Suppression of Random Dopant-Induced Threshold Voltage Fluctuations in Sub-0.1-µm MOSFET's with Epitaxial and δ-Doped Channels", IEEE Transactions on Electron Devices, vol. 46, No. 8, (Aug. 1999), pp. 1718-1724.

Bruel, M. , "Silicon on insulator material technology", Electronics Letters, vol. 31, No. 14, (Jul. 6, 1995), pp. 1201-1202.

Cheng, K. , et al., "Extremely Thin SOI (ETSOI) CMOS with Record Low Variability for Low Power System-on-Chip Applications", 2009 IEEE International Electron Devices Meeting (IEDM), (Dec. 7-9, 2009), pp. 3.2.1-3.2.4.

Clark, L. T., et al., "A Highly Integrated 65-nm SoC Process with Enhanced Power/Performance of Digital and Analog Circuits", International Electron Devices Meeting, IEDM 2012, (Dec. 10-13, 2012), pp. 14.4.1 to 14.4.4.

Colinge, Jean-Pierre , "Hot-Electron Effects in Silicon-On-Insulator n-Channel MOSFET's", IEEE Transactions on Electron Devices, vol. ED-34, No. 10, (Oct. 1987), pp. 2173-2177.

Courtland, Rachel , "Start-up Seeks New Life for Planar Transistors, SuVolta is pursuing precision doping in its bid to compete with 3-D transistor technology", ieee spectrum tech alert, (Dec. 8, 2011), 3 pp. total.

Frank, Martin M., "High-k / Metal Gate Innovations Enabling Continued CMOS Scaling", 2011 Proceedings of the ESSCIRC, (Sep. 12-16, 2011), pp. 50-58.

Fu, Y. , et al., "Subband structure and ionized impurity scattering of the two dimensional electron gas in δdoped field effect transistor", Journal of Applied Physics, vol. 78, No. 5, (Sep. 1, 1995), pp. 3504-3510.

Fujita, K. , et al., "Advanced Channel Engineering Achieving Aggressive Reduction of VT Variation for Ultra-Low-Power Applications", Electron Devices Meeting (IEDM), 2011 IEEE International, (Dec. 2011), pp. 32.3.1-32.3.4.

Hokazono, Akira , et al., "25-nm Gate Length nMOSFET With Steep Channel Profiles Utilizing Carbon-Doped Silicon Layers (A P-Type Dopant Confinement Layer)", IEEE Transactions on Electron Devices, vol. 58, No. 5, (May 2011), pp. 1302-1310.

Kuhn, Kelin J., et al., "Process Technology Variation", IEEE Transactions on Election Devices, vol. 58, No. 8, (Aug. 2011), pp. 2197-2208.

Kuhn, Kelin J., "Reducing Variation in Advanced Logic Technologies: Approaches to Process and Design for Manufacturability of Nanoscale CMOS", 2007 IEEE International Electron Devices Meeting (IEDM), (Dec. 10-12, 2007), pp. 471-474.

Maleville, Christophe , "Extending planar device roadmap beyond node 20nm through ultra thin body technology", 2011 International Symposium on VLSI Technology, Systems and Applications (VLSI-TSA), (Apr. 25-27, 2011), pp. 1-4.

Markov, Stanislov , et al., "Statistical Variability in Fully Depleted SOI MOSFETs Due to Random Dopant Fluctuations in the Source and Drain Extensions", IEEE Electron Device Letters, vol. 33, No. 3, (Mar. 2012), pp. 315-317.

Meyer, J. E., et al., "High Performance, Low Power CMOS Memories Using Silicon-On-Sapphire Technology", 1971 International Electron Devices Meeting, (1971), p. 44.

Noda, Kenji , et al., "A 0.1-µm Delta-Doped MOSFET Fabricated with Post-Low-Energy Implanting Selective Epitaxy", IEEE Transactions on Electron Devices, vol. 45, No. 4, (Apr. 1998), pp. 809-813.

Packan, P. , et al., "High Performance 32nm Logic Technology Featuring 2nd Generation High-k + Metal Gate Transistors", 2009 IEEE International Electronic Devices Meeting (IEDM), (2009), pp. 28.4.1-28.4.4.

Pawlak, B. J., et al., "Effect of amorphization and carbon co-doping on activation and diffusion of boron in silicon", Applied Physics Letters, 89, 062110, (2006), pp. 062110-1 to 062110-3.

Pawlak, B. J., et al., "Suppression of phosphorus diffusion by carbon co-implantation", Applied Physics Letters, 89, 062102, (2006), pp. 062102-1 to 062102-3.

Roy, G. , et al., "Random dopant fluctuation resistant 'bulk' MOSFETs with epitaxial delta doped channels", Ultimate Integration in Silicon (ULIS) Conference, Glasgow, Scotland, (2007), 4 pp. total.

Saraswat, Krishna C., "Shallow Junctions", downloaded from http://web.stanford.edu/class/ee311/NOTES/ShallowJunctions.pdf, (Apr. 10, 2006), pp. 1-20.

Takeuchi, Kiyoshi , et al., "Channel Engineering for the Reduction of Random-Dopant-Placement-Induced Threshold Voltage Fluctuation", 1997 International Electron Devices Meeting (IEDM), Technical Digest, (Dec. 7-10, 1997), pp. 841-844.

* cited by examiner

REDUCED LOCAL THRESHOLD VOLTAGE VARIATION MOSFET USING MULTIPLE LAYERS OF EPI FOR IMPROVED DEVICE OPERATION

CROSS-REFERENCE TO RELATED APPLICATIONS

This application claims the benefit of U.S. Provisional Patent Application No. 62/200,533 filed Aug. 3, 2015.

BACKGROUND OF THE INVENTION

1. Field of the Invention

The present invention generally relates to the structure and manufacturing of metal-oxide semiconductor field effect transistors (MOSFETs), and more particularly to MOSFETs manufactured for reproducibility of threshold voltages among otherwise identical transistors and for improvement of transistor performance. Further, this invention addresses random doping induced channel length modulation concerns in transistors manufactured with dimensions finer than 40 nm.

2. Prior Art

Integrated circuits (ICs) have found applications in all areas of human life, like home, health and communications to transportation. The device densities have been doubling every 18 to 24 months and device sizes have been scaling downward to achieve these densities. Currently the most prevalent device critical dimensions for typical silicon designs are 35 nm going down to 28 nm and the most advanced device critical dimensions are at 14 nm and 10 nm. At the finest scales, FinFET and SOI devices are displacing the more economical planar bulk CMOS devices.

As dimensions of metal-oxide semiconductor (MOS) field effect transistors (FETs) become smaller, the depletion regions of the transistors occupy a much smaller volume. Smaller volume implies a smaller absolute quantity of doping atoms, and the smaller quantity of dopant atoms is subject to increased random, statistical variations. Ultimately, key device properties subject to variations arising from the randomness of the exact positions of discrete dopants in and near the channel. Such variations, particularly random variations in threshold voltage ($\sigma VT$), are impacting the functionality of all low-power circuits, especially static random access memories (SRAM). Random variations in threshold voltage increase both the minimum voltage required for reliable SRAM operation and the leakage current. Both effects have an adverse impact on the power consumption at a given level of performance.

Random threshold variations $\sigma VT$ in conventional planar MOS transistors are caused by several factors. The dominant factors are: (i) random dopant fluctuations (RDF) in the well and in the pocket implant regions underneath the gate, which, among other things, cause variations in depletion layer thickness; (ii) line edge roughness (LER) which causes random variations in the length of the gate electrode resulting from random variations in profile of the etched gate; (iii) metal gate granularity (MGG) in high-k metal gate technologies which causes random variations in the local work function due to the grain structure of the gate material; (iv) poly-silicon granularity in poly-silicon gate technology, which causes potential pinning at grain boundaries and corresponding local threshold voltage variation; and (v) the randomness in the effective channel length, arising from statistical variations in the position of the junction that separates the channel from either the source or the drain extensions. This last effect has significant roots in the ion implantation processes used to form transistor sources and drains. Both the scattering of discrete dopants associated with implantation and the heat treatments required for activation contribute to uncertainties in the final positions of channel-length defining junctions.

FIGS. 1A and 1B show a typical approach to creating source and drain structures in a planar MOS transistor. FIG. 1A shows a cross-section of a substrate with well implants 110, and that has a gate oxide 120 grown on it. Over the gate oxide there is a silicon gate 130, either polycrystalline or amorphous, and that gate has been oxidized to form an oxidation layer 140 subsequent to patterning. FIG. 1A shows an ion implantation or a sequence of implantations 151 that are used to create source and drain extensions 150. In contemporary processes, the implant sequences for NMOS transistors include arsenic and/or phosphorous for drain extensions and boron and/or indium for pocket implants. Similarly, the implant sequences for PMOS transistors include boron, indium and/or $BF_2$ for drain extensions and phosphorous and/or arsenic for pocket implants.

FIG. 1B further shows a spacer 160 that has been formed by chemical vapor deposition (CVD), with or without plasma assistance, typically of silicon nitride or silicon oxide. Through the use of anisotropic plasma etching, the deposited material is removed from all surfaces parallel to the silicon wafer surface, but due to the anisotropic nature of the etch, the spacers 160 remain on the sidewalls. The spacers protect the source and drain extensions 150 during the ion implantations 171 that create the very heavily doped source and drain regions 170. Again, single or multiple implants may be used to fabricate the transistor sources and drains. During ion implantation steps 151 and 171 the implanted region of the semiconductor, typically silicon, is made amorphous and an annealing step is needed to repair crystal damage, re-crystallize the amorphous semiconductor regions and to activate the dopants. While at least one annealing step is required, some process flows require multiple annealing steps. Rapid thermal annealing is the current norm for implants 151 and 171, where peak temperatures can exceed 1000° C. Depending upon the process, annealing times range from microseconds to tens of seconds. The sheet resistance of the source and drain regions 170 is further reduced by reaction with deposited metallic Ti, Co or Ni to form a highly conductive layer of metal silicide 180. These steps are followed by the formation of interlayer dielectrics (ILD), contacts, and multiple layers of interconnect in the usual process flows.

At high drain bias, the implanted drain regions that extend into the semiconductor substrate, act as side gates, influencing the channel region and controlling the carriers in the channel; this is responsible for drain induced barrier lowering (DIBL) and strong short channel effects. Very high channel doping is needed to control the short channel effects in contemporary, prior art bulk CMOS technologies. The high channel doping results in very large random dopant induced threshold voltage variations which dominate the statistical threshold voltage variability in bulk MOSFETs. High channel doping also reduces the transistor conductance because impurity scattering leads to very low mobility in the channel.

Even though the gate 130 and its oxide 140 act as a hard mask, the final locations of the channel defining edges of the source and drain extensions 150 are subject to localized, random variations. Some of these variations are associated with scattering of the implanted ions as they recoil from collisions with semiconductor nuclei prior to coming to rest in the silicon, and some of the variations are associated with enhanced local diffusion of the dopant ions assisted by crystalline defects created during the annealing processes. The overall effect of these uncertainties is to impose a random variation on the length of the channel. For transistors having channel lengths of less than 65 nm, the channel length affects both the threshold voltage and the current carrying capability of the transistors. Some of these effects are further increased by pocket implants used in the drain extension formation sequence 151. The ultimate locations of the source-to-channel and drain-to channel junctions are subject to variations that are exaggerated by the local differences between two large, statistically uncertain doping densities.

Statistical uncertainties are unavoidable in minute devices that depend upon substrate doping to fix their threshold voltages. These uncertainties are only exaggerated by implanted source and drain doping ions that are randomly scattered into the substrate regions near the transistor channels.

A further effect of the heavy doping in traditional source and drain regions is the penetration of ions from these heavily doped sources and drains into the substrate, forming deep junctions, frequently to depths that are comparable to the designed channel lengths. The electrostatic effect of these deep junctions is to pass partial control of the threshold voltage to the drain voltage, resulting in a net reduction of the threshold voltage, increased subthreshold slope and drain induced barrier lowering (DIBL) and increased random variability. These effects work together to increase circuit leakage.

The electrostatic effect is illustrated in FIG. 1C, which shows the electric fields perpendicular to the silicon surface at the intersection of the substrate and the gate dielectric in prior art transistors. This instance is a transistor with zero volts on the gate and source and 1 volt on the drain. Note that the drain voltage induces a vertical electric field ranging up to nearly $10^6$ volts/cm over a large portion of the channel region. These fields are particularly important in the channel region close to the source.

Random threshold variations associated with random doping density variations have been known in the past, but their effects were not critical until the gate lengths of the devices were scaled below 65 nm. and the supply voltages were scaled to 1 volt and below. Some approaches to mitigate these effects involve the use of a very lightly doped epitaxial semiconductor layer beneath the gate. The use of very lightly doped channel regions with implanted source and drain and extensions in transistors with gate lengths below 45 nm have been found to be more prone to threshold perturbations by the uncertain locations of the tails of source/drain extension implants, some of which are related to dopant scattering.

Solutions have also been proposed to mitigate the effect of channel length variation of small devices by the use of raised epitaxial source and drain regions with implantation doping in the raised epitaxial regions. These allow superior source and drain conductivity, particularly in semiconductor-on-insulator (SOI) devices, but these structures do not provide a solution for the variations in threshold voltage (cNT) of the devices due to doping variations. Use of selective epitaxial growth in selectively etched down extension regions have also been proposed to have shallow extensions, improving the device characteristics, but none of these directly address the threshold variation issues of the small devices.

In view of the deficiencies of the prior art it would be advantageous to provide a transistor structure and a manufacturing process that reduce variations between otherwise identical transistors by improved control of the channel length, the location of the channel edge and variations in location of dopant atoms under the gate. It is further desirable to have devices with planar junctions that provide improved electrostatic control with low and uniform doping concentrations in the channel.

DETAILED DESCRIPTION OF THE PREFERRED EMBODIMENTS

Figure 1A:
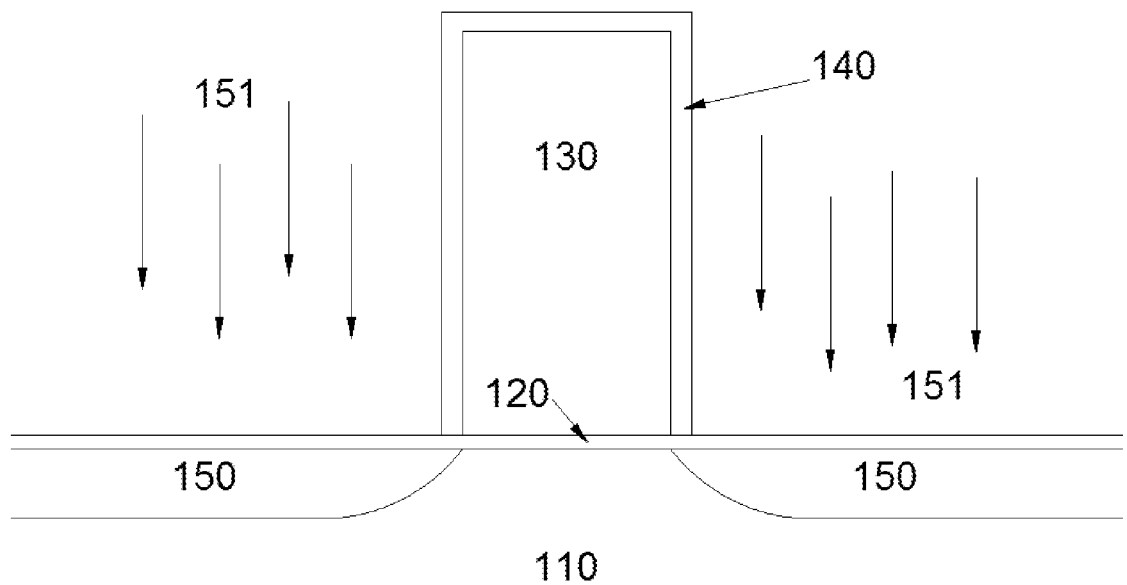
FIG. 1A is a schematic cross-section of a MOSFET gate with the source/drain extension implant (prior art).
Figure 1B:
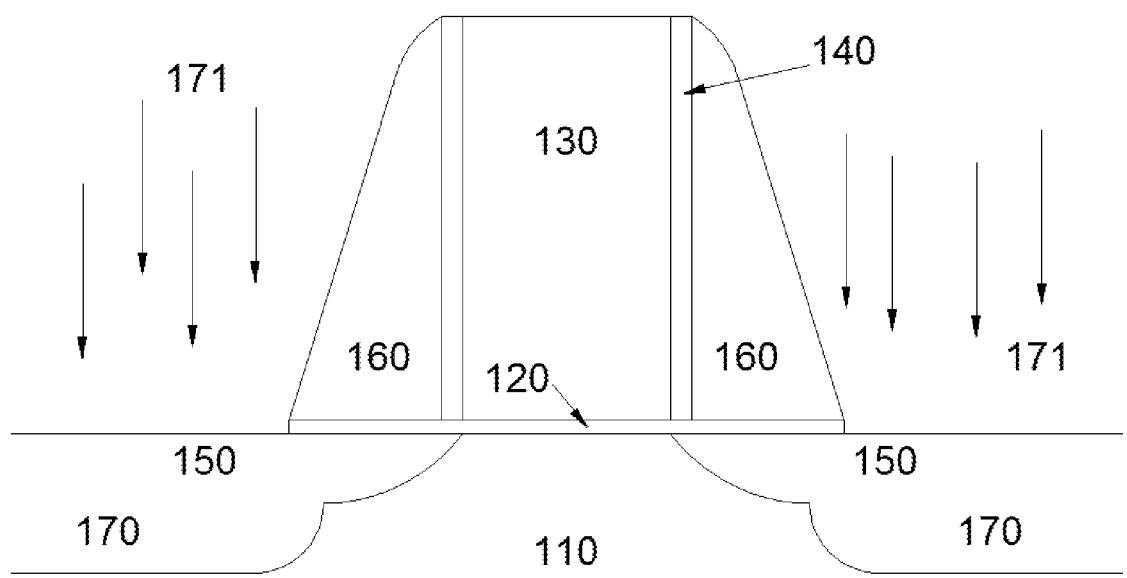
FIG. 1B is a schematic cross-section of a MOSFET gate with a spacer in place and the heavy source/drain (N+ or P+) implant (prior art).
Figure 1C:
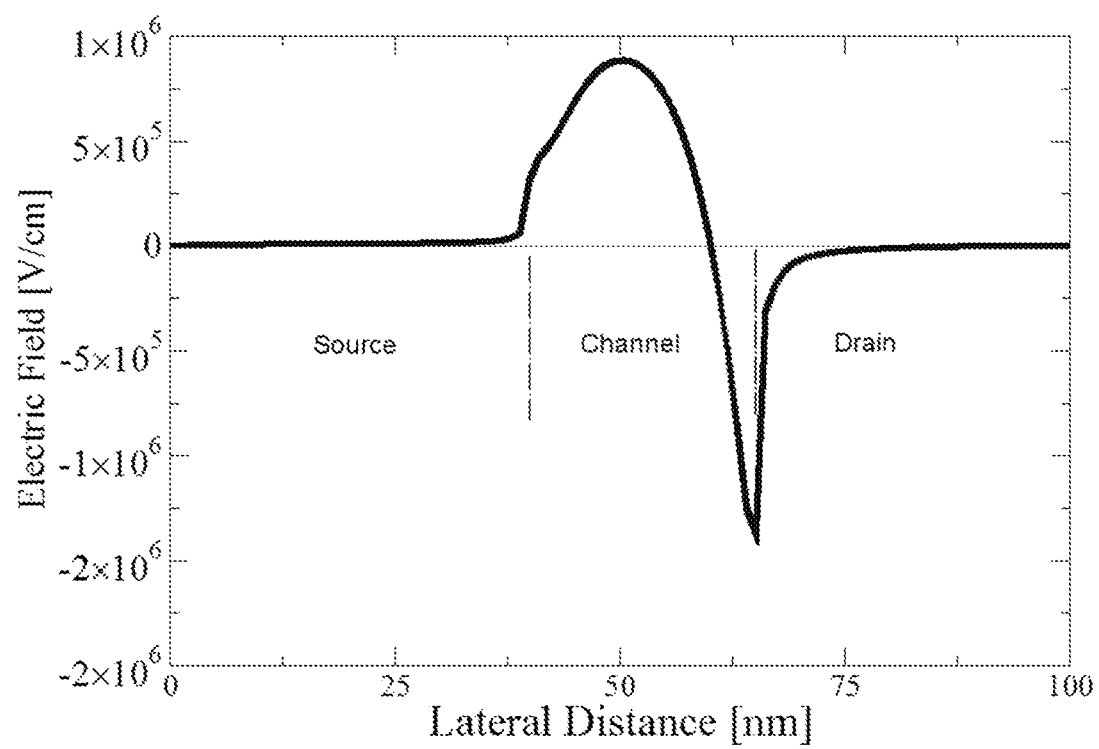
FIG. 1C is an illustration of the electric fields perpendicular to the silicon surface in a transistor realized using the prior art.
Figure 2A:
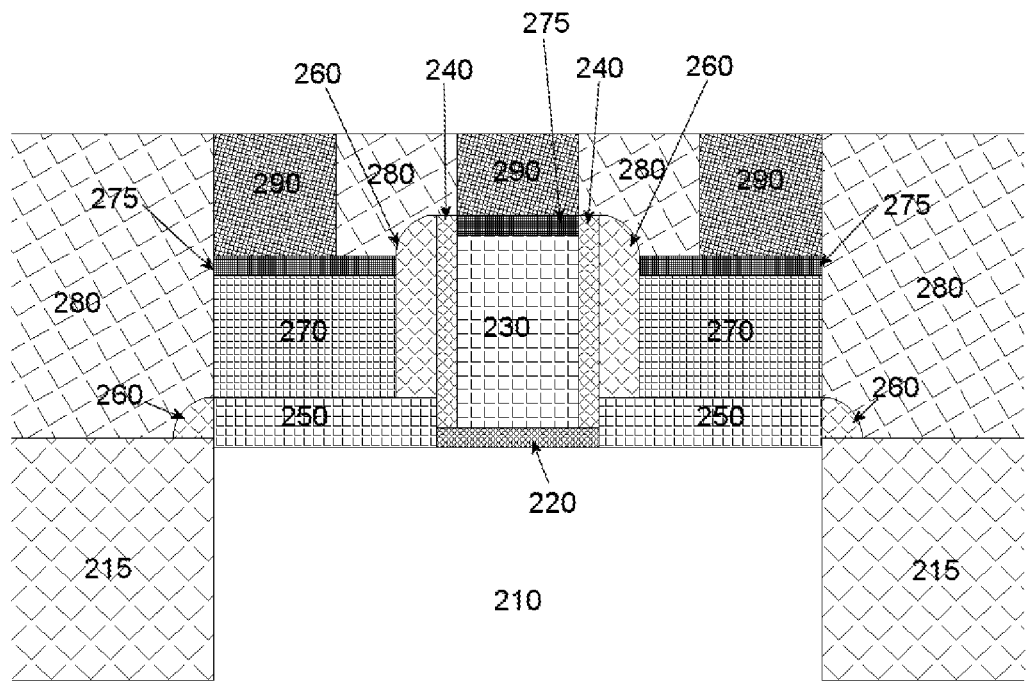
FIG. 2A is a schematic cross-section of a transistor realized in accordance with an embodiment.

Several factors impact the variations in the threshold voltage of nominally identical transistors. Among them are inevitable randomness of ionized dopants beneath the gate, variations in the effective channel length that are associated with the randomness of the scattering of source/drain extension implants (RXF), uncertainty in the activation of those ions, and the counting statistics of their intersection with pocket and well implants. These variations, important because of tiny device dimensions, are exacerbated by short channel effects. The solutions are to avoid ion implantation with its associated uncertainties in final dopant ion positions and to avoid temperatures that are high enough to further exacerbate the random final locations of active dopant ions. The described and disclosed transistor structure and process are based on using low temperature epitaxy to form source/drain structures, where low temperature typically means 650° C. or less. Further, these structures are raised with respect to the substrate, and their substrate interface is essentially coplanar with the gate oxide interface with the substrate. The region beneath the channel may be lightly doped compared with the prior art, or it may include a substantially undoped epitaxial layer. This is illustrated by FIG. 2A, a schematic cross section of the basic transistor utilizing this construction principle. In this figure, 210 is a substrate, doped appropriately to obtain, with the gate structure, a desired threshold voltage for the transistor. The transistor is typically formed in an area isolated from devices on the die with shallow trench isolation 215. The gate structure of the transistor consists of a gate dielectric 220, a conducting gate electrode 230, frequently doped polycrystalline silicon, and the gate contact 275. The differentiating structures are epitaxial source and drain extensions 250, and the epitaxial source and drain conductors 270. The extensions 250 are formed of thin epitaxy, and they are separated from the gate conductor 230 by a layer of dielectric 240, typically silicon dioxide or silicon oxy-nitride. A typical lower limit on the thickness of dielectric 240 is the thickness of the gate dielectric 220; an upper limit would be three times the gate dielectric 220 thickness. The more heavily doped source and drain conductors 270 are also formed by low-temperature epitaxy. They are separated from the gate conductor 230 by a dielectric spacer 260 in addition to the thin dielectric 240 on the gate sidewall. In order to minimize parasitic capacitance, the spacer 260 will be much thicker than the gate dielectric 220, 10 to 300 times thicker.

The formation of the source and drain extensions 250 and subsequent processing is done in a way to substantially prevent diffusion of dopant atoms from the extensions 250 into the substrate 210, thereby creating substantially abrupt source and drain junctions that are aligned along the planar surface of the substrate at the interface between the substrate and the epitaxial extensions. For example, this can be accomplished by forming the drain extensions 250 at a low temperature, typically 650° C. or lower, forming the more heavily doped epitaxial layers 270 at a similar temperature, and restricting subsequent processing to that temperature or less. In a more general case, the growth of the epitaxial layers 250 and 270 and further processes at elevated temperatures can be optimized so the time and temperature combinations substantially prevent diffusion of dopant ions from the source and drain extensions 250 into the substrate 210.

Figure 2B:
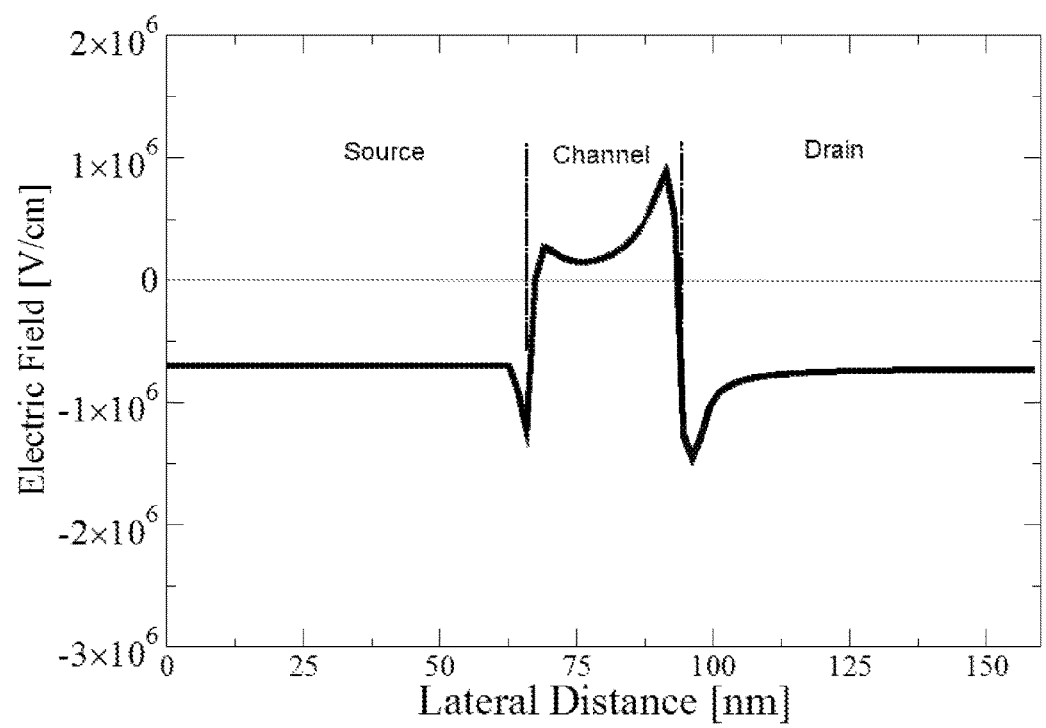
FIG. 2B is an illustration of the electric fields perpendicular to the silicon surface in the transistor illustrated in FIG. 2A.

In the currently described invention, the source and drain extensions 250 do not extend into the substrate 210. Their bases are coplanar with the interface between the substrate 210 and the gate oxide 220. This configuration gives results in the electric fields shown in FIG. 2B. This figure shows the electric fields perpendicular to the surface of the substrate of a turned-off transistor with 1 volt on the drain. The electric fields near the source are modest, less than $5 \times 10^5$ volts/cm, over most of the channel region. As a result the drain control of the charge in the channel is greatly reduced, improving the electrostatic integrity and allowing much lower channel doping without adversely affecting the subthreshold slope, DIBL and the corresponding leakage. This reduces the tendency of the drain voltage to alter the threshold voltage (short channel effect). The new geometry also reduces the tendency of the transistor to break down by punch-through.

Figure 3A:
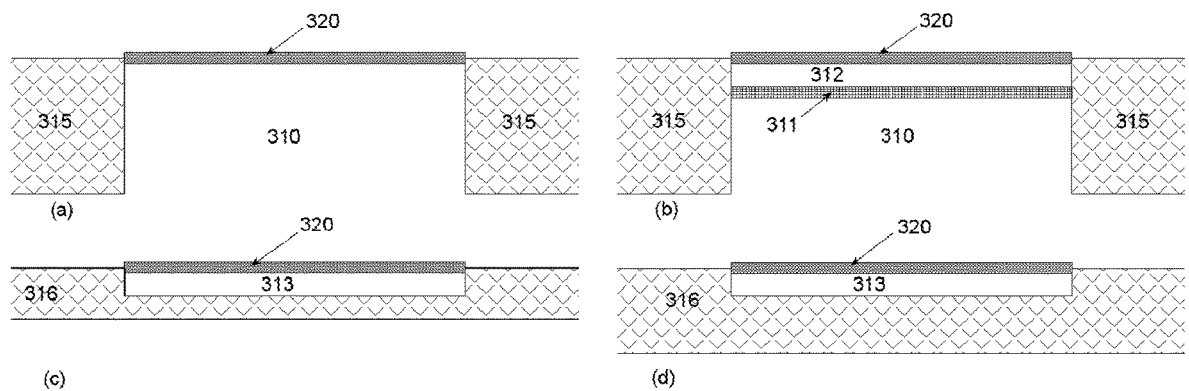
FIG. 3A are schematic cross sections representative of substrate configurations that are consistent with embodiments.

The source and drain structures 250 and 270 may be used with a variety of transistor substrate configurations. FIG. 3A shows some examples. With FIG. 3A, example (a) is a conventional substrate, where the substrate 310 beneath the transistor is doped with one or more well implants, p-type for NMOS transistors or n-type for PMOS transistors. These may be regular implanted wells or retrograde wells providing a low doped surface at the channel, The gate oxide is indicated as 320, and shallow trench isolation is 315. Example (b) shows an approach to reduce the effect of the random doping variations beneath the gate oxide 320. Layer 312 is an un-doped epitaxial layer, immediately beneath the gate oxide 320. In this substrate, layer 311 is optional, but when used it is typically heavily doped to combine threshold voltage control and minimal RDF variations in epitaxial transistors. Example (c) is representative of a silicon-on-insulator transistor, with a thin single crystal active layer 313 lying over a thin buried oxide 316. The thin buried oxide allows a degree of threshold modulation by changing the voltage on the substrate under the isolation and buried oxide. Example (d) is similar to (c), except the oxide beneath the active layer 313 is much thicker, decreasing parasitic capacitance but eliminating convenient threshold modulation. The transistor structure disclosed is usable with any of these classes of substrates.

Figure 3B:
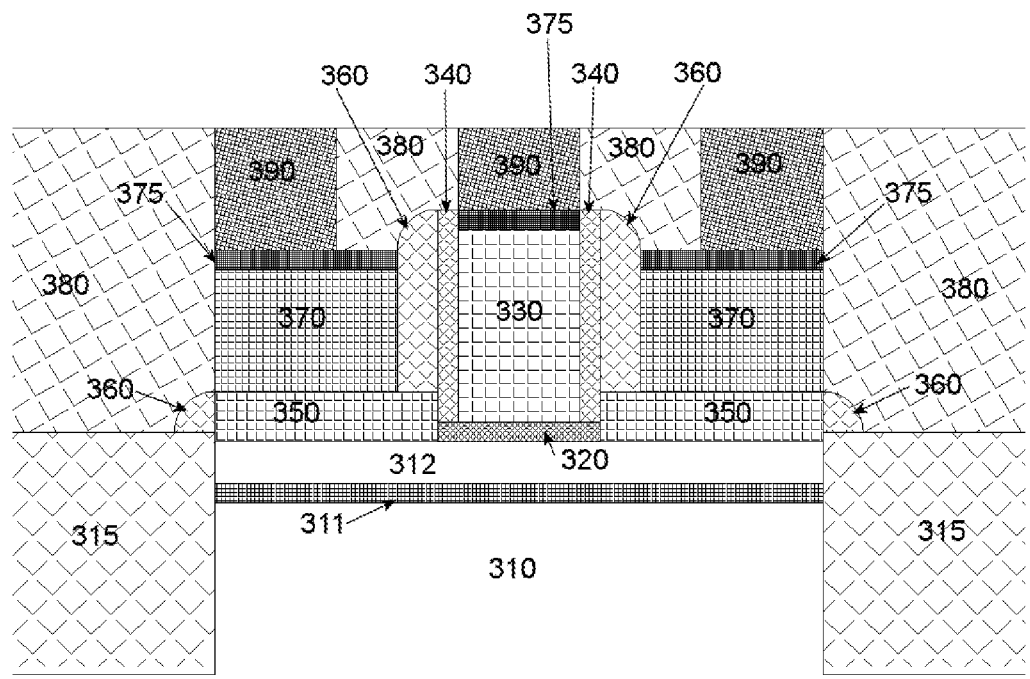
FIG. 3B is a schematic cross section of a transistor realized in accordance with an embodiment and using a substrate with an extremely low-doped epi layer.

FIG. 3B shows a schematic representation of the transistor of FIG. 2A realized using a substrate with an undoped or very lightly doped epitaxial layer 312 supporting the transistor's channel. The thickness of this layer 312 is designed to minimize the threshold variations arising from statistical variations in the layers 310 and 311 below. Typical thicknesses for layer 312 lie in the range of 3 nm to 30 nm. As noted above, the well region is denoted 310, and layer 311 is an optional layer of high doping, acceptors for an NMOS transistor or donors for a PMOS transistor. In the extreme, layer 311 is a monolayer of extremely high doping, frequently called a delta layer, with reference to the Dirac delta function. The transistor structure above the undoped layer 312 includes the gate oxide or gate oxide stack 320, a first, source/drain extension layer 350 formed by low-temperature epitaxial growth. The elimination of diffusion from the source/drain extensions is particularly important when the channel has zero or very light doping. The tails of conventional doping profiles would create irregular variations in the channel length. The second epitaxial layer 370 provides superior conduction and connectivity to the transistor, and it is also grown at low temperature after the formation of dielectric spacers 360.

As discussed above, the transistor described here can be realized on a variety of substrates, including SOI, and with a variety of gate architectures, including FinFETs, but the descriptions below will address conventional substrates. Two representative embodiments will be described. The first is a simple adaptation of the most common polysilicon gate transistor structure. The second illustrative embodiment is based on the Gate Last method of fabricating transistors with Hi-K gate dielectrics and work-function-controlled metal gates.

Gate First Embodiment

Figure 4A:
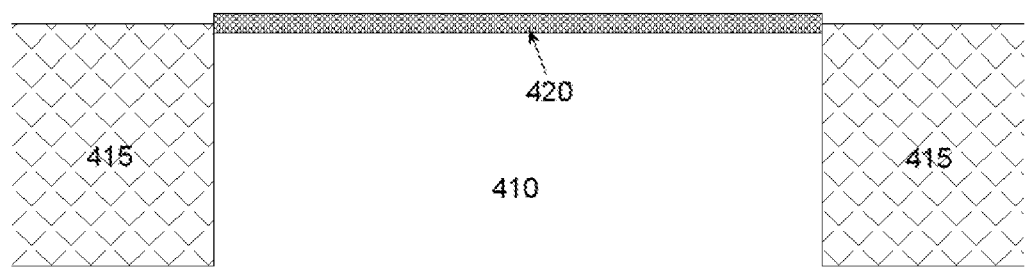
FIG. 4A is a schematic cross section of a conventional substrate with gate oxide and shallow trench isolation as it may be used with an embodiment.

FIG. 4A shows a gate oxide 420 grown over a well 410 in a semiconductor substrate on which an integrated circuit is to be formed. The region to be occupied by the subject transistor is isolated from other devices by shallow trench isolation regions 415. In general, the well 410 will be doped with acceptors, boron (B) or indium (In) ions, if the subject transistor is to be n-type, or it will be doped with donors, phosphorus (P), arsenic (As) or antimony (Sb), if the subject transistor is to be p-type. In the vicinity of the transistor, doping densities in the range of $1 \times 10^{17}$ to $5 \times 10^{18}$ ions per $cm^3$ are representative, and there is no requirement for extreme doping gradients. In common practice, the gate oxide 420 may be nitrided and a substrate may include one or more oxide thicknesses, as appropriate for the intended operating voltages.

Figure 4B:
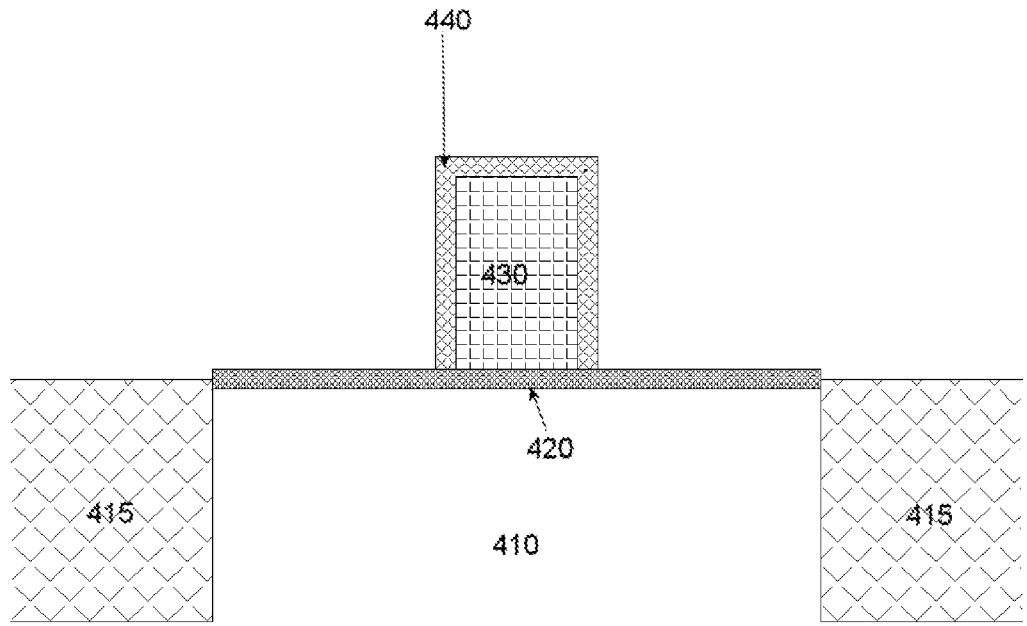
FIG. 4B is a schematic cross section of a patterned gate and sidewall oxidation in accordance with an embodiment.

FIG. 4B shows the result of depositing amorphous or polycrystalline silicon and patterning that material to for a gate 430. Since the use of a silicon nitride hard mask is common in patterning gates 430, some process flows may retain that hard mask on the top surface of the gate 430. With or without a retained hard mask, the next step is to create a sidewall oxide 440 on the patterned gate 430. This oxide will preferably have a thickness approximating the thickness of the gate oxide 420.

While FIG. 4B shows a polysilicon gate and a conventional $SiO_2$-based gate dielectric, the gate structure could alternatively be composed of a metallic gate 430 with controlled work function overlying a high-K gate dielectric 420, possibly comprising an oxide or nitride of hafnium. References below to gate oxide would apply equally to any other selected gate dielectric.

Figure 4C:
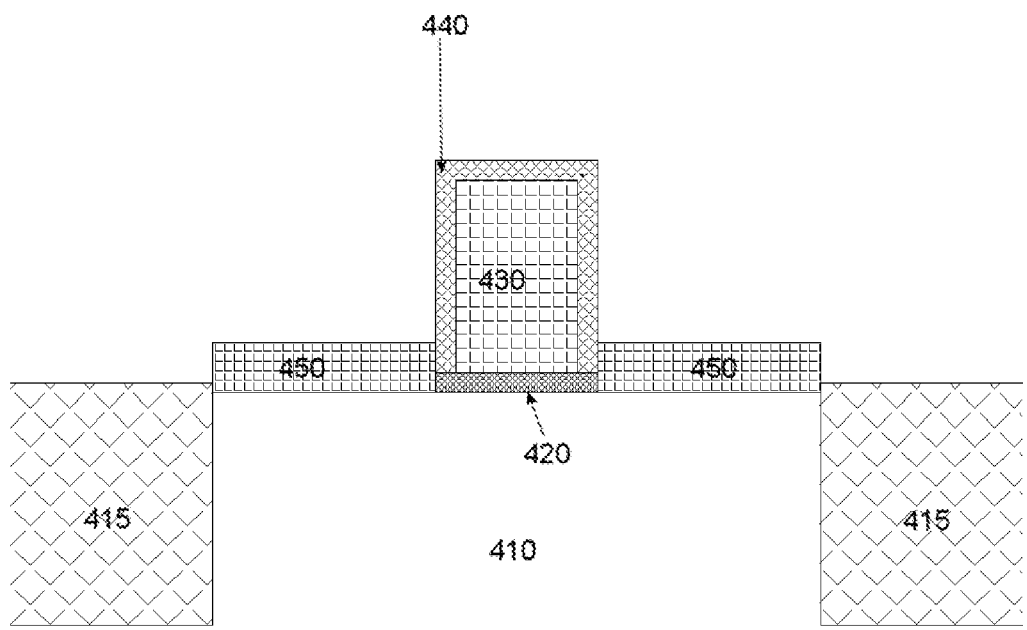
FIG. 4C is a schematic cross section of epitaxial source and drain extensions in accordance with an embodiment.

FIG. 4C illustrates the results of two critical steps. The first is using an anisotropic etch to clear the gate oxide 420 from the well regions 410 not protected by either the gate 430 or its sidewall oxide 440. The next step is low-temperature, selective epitaxial growth of the source/drain extensions 450. These regions 450 are grown to a typical thickness of 3 to 20 nm, thick compared to the gate oxide 420, but thin compared to the height of the gate 430. The epitaxial drain extensions 450 are grown at relatively low temperatures, 500° C. to 700° C., and they are doped during the growth process to a typical doping density of $1 \times 10^{20}$ to $5 \times 10^{20}$ ions per $cm^3$. For n-type transistors, the source/drain extensions 450 would normally be doped with phosphorus or arsenic, and the epitaxial material would be silicon. For p-type transistors, the epitaxial material would preferably be silicon-germanium, to facilitate achieving the target doping levels of boron or possibly indium, and to allow the application of a compressive strain in the channel, enhancing mobility and performance. Note that the residual sidewall oxide 440 will be subjected to the extremes of gate to source voltages and drain to gate voltages, so its thickness has to be comparable to or greater than the gate oxide thickness, but still thin enough to avoid a potential barrier between the gate region and the epitaxial source/drain regions. Dimensional control and electrostatic coupling control depend upon having an abrupt junction between the drain extension 450, doped with dopant ions of a first type and the substrate 410, undoped or doped with dopant ions of a second type, The ideal would be a step junction between the well region 410 and the epitaxial extension 450, with one monolayer reflecting the doping density of the well 410 and the adjacent monolayer reflecting the doping density of the extension 450. Substantially abrupt junctions can be realized by minimizing the diffusion from the drain extension 450 and the substrate 210. This is typically achieved by using low temperatures for the epitaxial growth of this and the succeeding epitaxial layers and for subsequent process steps in order to establish the most abrupt transition between the higher doping of the drain extension 450 and the adjacent, low doping of the underlying substrate 410. This abrupt transition helps minimize the variation in transistor thresholds and provide for other improved transistor characteristics, and it can only be realized if all processing temperatures are kept low. Further, the times and temperatures of the epitaxial depositions and subsequent processing of the disclosed process are optimized to provide a substantially abrupt junction between the source and drain extensions 450 and the substrate 410.

Figure 4D:
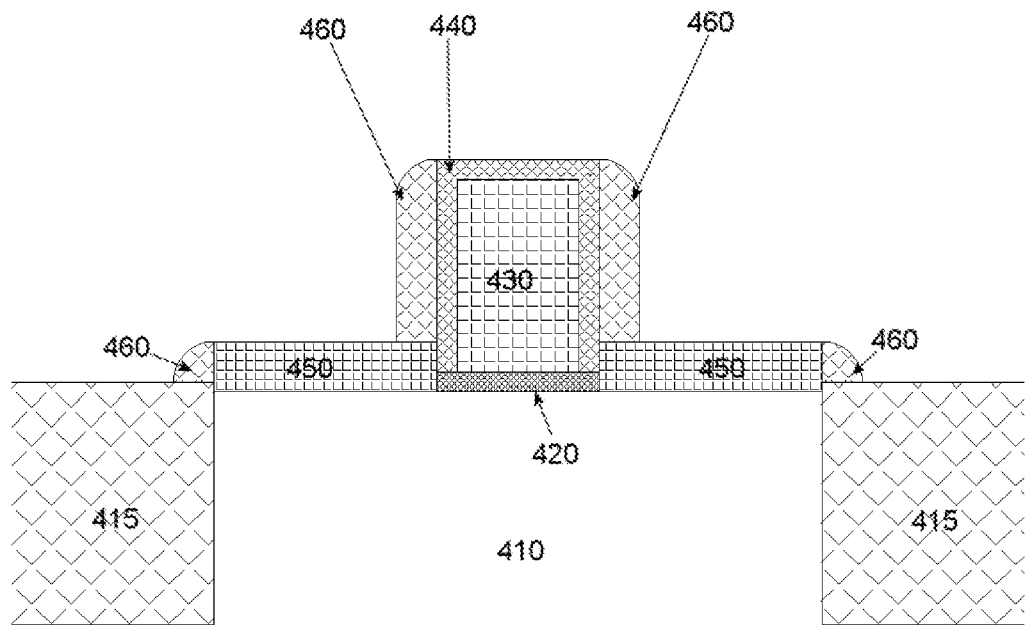
FIG. 4D is a schematic cross section of sidewall spacers adjacent the gate in accordance with an embodiment.

Because the oxide 440 is thin, the capacitance between the source/drain extensions 450 and the gate 430 has the potential to degrade transistor performance. The drain-to-gate capacitance is particularly critical because it is enhanced by the Miller effect. To utilize a thick, high conductivity source/drain, more dielectric isolation is required. FIG. 4D illustrates the formation of a dielectric spacer 460 on the exposed sides of the gate 430. While the exact nature of the spacers 460 are not critical to the transistor, they are typically formed by depositing a dielectric like silicon nitride, and then using an anisotropic etch to clear the nitride from the surfaces paralleling the substrate while leaving a sidewall of dielectric on the surfaces perpendicular to the substrate. In advanced technology nodes the silicon nitride spacer may be replaced by a spacer formed from a material having lower dielectric constant. Small fillets of the spacer 460 may remain adjacent to the source/drain extensions 450, but they have no significant effect.

Figure 4E:
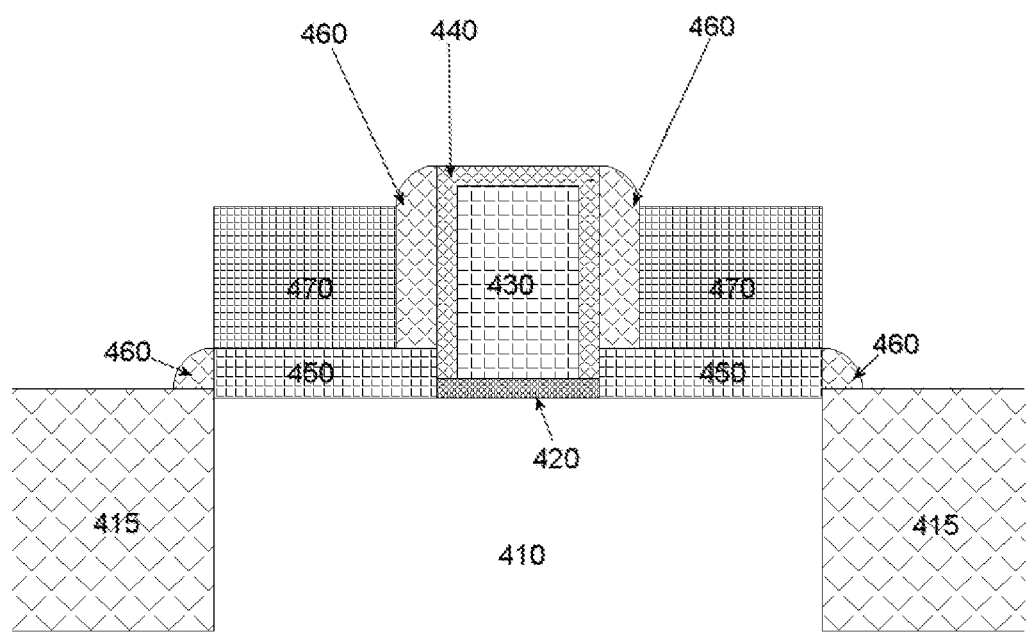
FIG. 4E is a schematic cross section of high-conductivity epitaxial source and drain regions in accordance with an embodiment.

In order to provide robust, high-conductivity sources and drains, a second epitaxial step produces the source and drain regions 470, as shown in FIG. 4E. These epitaxial layers 470 are also doped during growth to typical levels of $5 \times 10^{20}$ to $1 \times 10^{21}$ ions per $cm^3$. For n-type transistors, the source/drain regions 470 would normally be doped with phosphorus or arsenic, and the epitaxial material would be silicon. For p-type transistors, the epitaxial material would preferably be silicon-germanium, to facilitate achieving the target doping levels of boron, most frequently, or possibly indium and to increase the compressive strain in the channel. Again, low temperature epitaxy, 500° C. to 700° C. is preferred in order to minimize the diffusion of dopants among the various regions of the transistor. The thickness of the source/drain regions 470 is greater than the thickness of the source/drain extensions 450, and it may be comparable to the height of the gate 430.

The source/drain structure 470 may comprise more than a single epitaxial layer. Other layers may be used to provide either tensile or compressive stress in the transistor channel or to provide other specific device characteristics. Further, while the descriptions above have indicated that silicon would be a logical choice for the epitaxial material in layers 450 and 470 for NMOS transistors, and silicon-germanium would be a logical choice for layers 450 and 470 for PMOS transistors, other choices may be elected, including III-V compound semiconductors, silicon-carbon and silicon-carbon-germanium. The requirement for low-temperature processing remains.

Figure 4F:
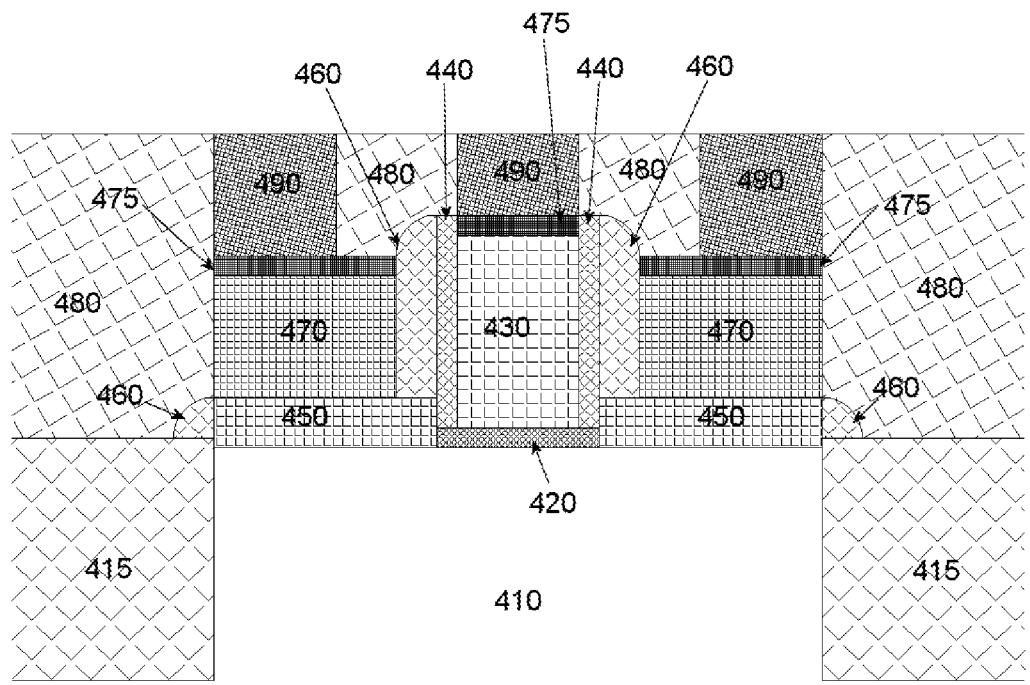
FIG. 4F is a schematic cross section of a completed transistor, including salicide contact layers, interlayer dielectric and metallic contact plugs in accordance with an embodiment.

The finished transistor is shown in FIG. 4F, where industry standard steps have been used to cap the gate 430 and the epitaxial source/drain regions 470 with a metal silicide 475. Common silicides include NiSi, $CoSi_2$ and $TiSi_2$. In some instances, the advantages of this transistor structure may be retained and the processing simplified by growing the epitaxial source and drain extensions 450 to a greater thickness, at the expense of increased parasitic capacitance, then forming the suicide 475 directly on the epitaxial layers 450 after forming the spacer 460. In order to improve the contact metallization it is possible to use a graded epitaxial layer, or multiple epitaxial layer depositions to achieve a high doped surface for silicidation and contact formation. An interlayer dielectric 480 is formed by depositing a silicon dioxide based material after the silicidation 475 and using CMP to create a planar surface. Finally, contact holes are etched and filled with tungsten plugs 490 using industry standard steps and materials sequences that are not detailed here.

At this point, the transistor is ready for interconnection using patterned metal layers that contact the tungsten contact plugs 490.

Gate Last Embodiment

Certain aggressive CMOS processes utilize a process sequence called "Gate Last." This sequence enables the use of exotic high-dielectric-constant gate dielectrics and metal gates having well specified work functions. By processing the gate-related materials after the high-temperature steps have all been completed, a wide spectrum of compounds can be employed without concern for their thermal degradation. Further, metallic gate materials will not be subject to re-crystallization, another source of threshold variability. The double epitaxial structures can be used advantageously with Gate Last technologies, as discussed in the paragraphs below.

Figure 5A:
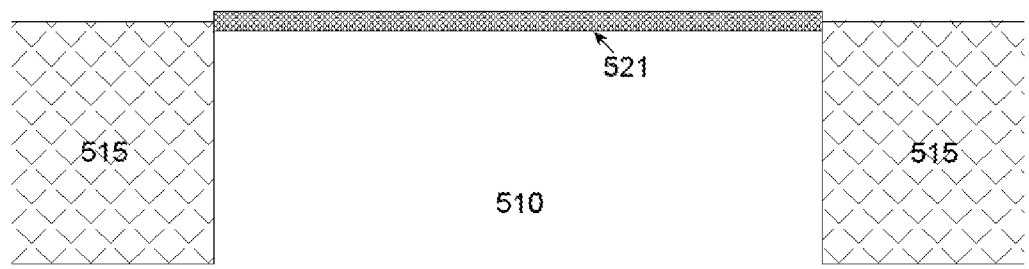
FIG. 5A is a schematic cross section of a conventional substrate with gate oxide and shallow trench isolation as it may be used with an alternative embodiment.

FIG. 5A shows a schematic cross-section of the commencement of transistor processing. The region 510 is a portion of the substrate having well implants for either an NMOS or a PMOS transistor. That transistor region is separated from other components on the chip by shallow trench isolation 515. The oxide layer 521 may be a screen oxide for early implant steps or it may be a gate oxide for conventional, gate-first transistors, input and output transistors for example, to be fabricated on the same chip. Several of the subsequent steps are identical to the equivalent steps for a Gate First embodiment.

Figure 5B:
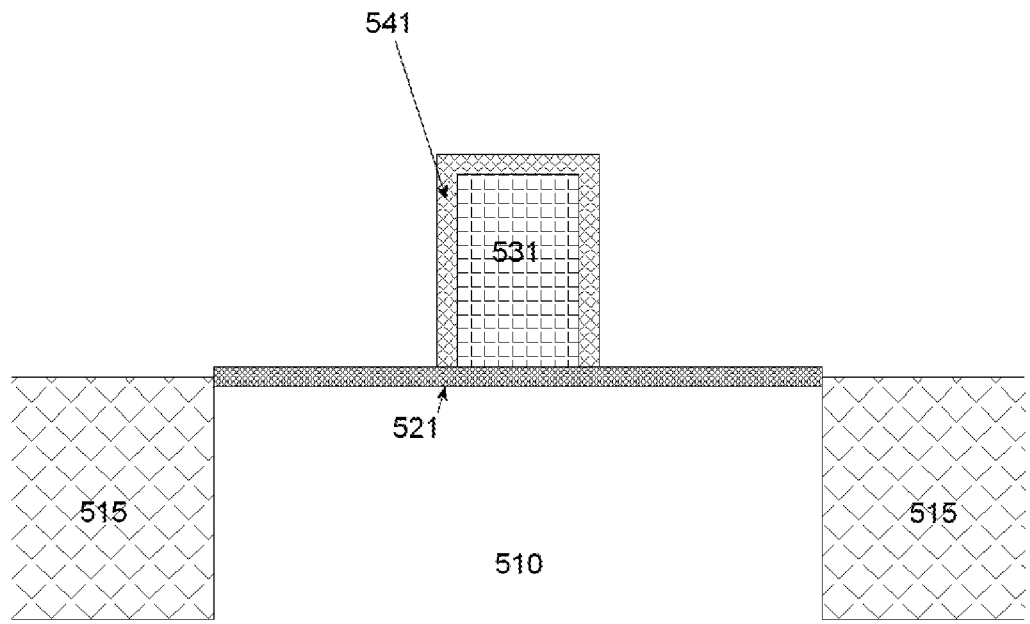
FIG. 5B is a schematic cross section of a conventional substrate with an oxidized sacrificial gate as it may be used with an alternative embodiment.

FIG. 5B shows the result of depositing amorphous or polycrystalline silicon and patterning that material to form a sacrificial gate 531. Since the use of a silicon nitride hard mask is common in patterning gates 530, some process flows may retain that hard mask on the top surface of the sacrificial gate 531. With or without a retained hard mask, the next step is to create a sidewall oxide 541 on the patterned sacrificial gate 531. The target thickness of the sidewall oxide will be determined by the other steps to follow.

Figure 5C:
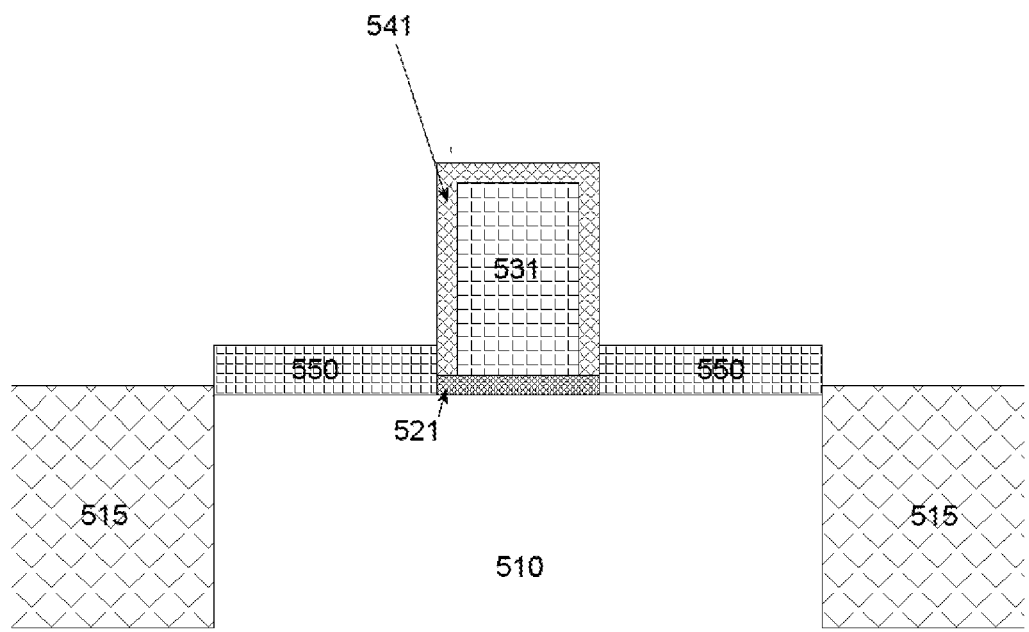
FIG. 5C is a schematic cross section of a conventional substrate with the addition of an epitaxial source/drain extension layer as it may be used with an alternative embodiment.

FIG. 5C illustrates the results of two critical steps. The first is using an anisotropic etch to clear the gate or screen oxide 521 from the well regions 510 not protected by either the sacrificial gate 531 or its sidewall oxide 541. The next step is low-temperature, selective epitaxial growth of the source/drain extensions 550. These regions 550 are grown to a thickness of 3 to 20 nm, thick compared to the ultimate gate oxide 520, but thin compared to the height of the sacrificial gate 531. The epitaxial drain extensions 550 are grown at relatively low temperatures, 500° C. to 700° C., and they are doped during the growth process, to typical doping densities of $1\times10^{20}$ to $5\times10^{20}$ ions per $cm^3$. For n-type transistors, the source/drain extensions 450 would normally be doped with phosphorus or arsenic, and the epitaxial material would be silicon. For p-type transistors, the epitaxial material would preferably be silicon-germanium, to facilitate achieving the target doping levels of boron, or possibly indium.

The interfaces between the epitaxial source/drain extensions 550 and the well region 510 should be as close as possible to ideal step junctions, a quality which requires a minimum of thermal exposure during the epitaxial growth and all subsequent processing.

Figure 5D:
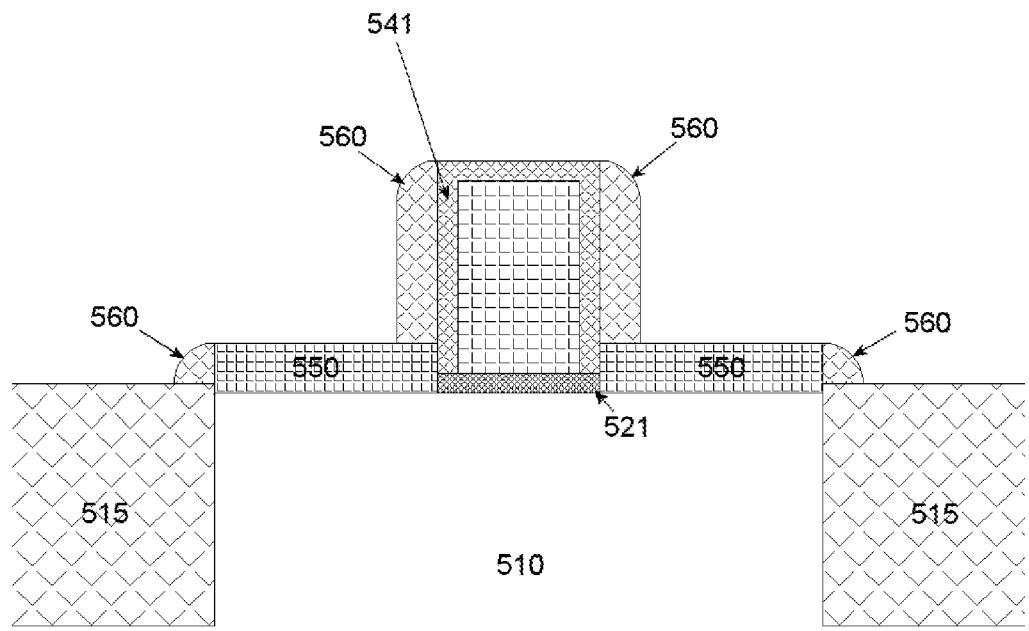
FIG. 5D is a schematic cross section of a conventional substrate with addition of spacers adjacent to the sacrificial gate as it may be used with an alternative embodiment.

To avoid transistor performance degradation, relatively low specific capacitance is needed between the greater source and drain structures and the ultimate transistor gate. FIG. 5D illustrates the formation of spacer 560 on the exposed sides of the sacrificial gate 531. While the exact nature of the spacer 560 is not critical to the transistor, it is typically formed by depositing a dielectric like silicon nitride, and then using an anisotropic etch to clear the nitride from the surfaces paralleling the substrate while leaving a sidewall of dielectric on the surfaces perpendicular to the substrate. Small fillets of the spacer 560 may remain adjacent to the source/drain extensions 550, but they have no significant effect.

Figure 5E:
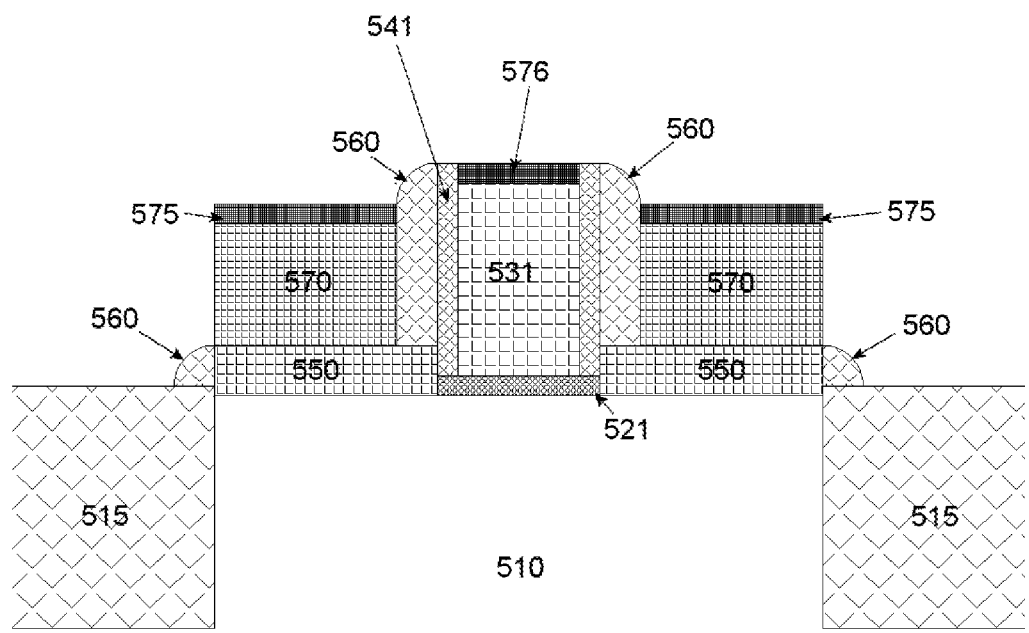
FIG. 5E is a schematic cross section of a conventional substrate with the source and drain structures completed with a second epitaxial layer and salicide layers as it may be used with an alternative embodiment.

In order to provide robust, high-conductivity sources and drains, a second epitaxial step produces the source and drain regions 570, as shown in FIG. 5E. These epitaxial layers 570 are also doped during growth to typical levels of $5\times10^{20}$ to $1\times10^{21}$ ions per $cm^3$. For n-type transistors, the source/drain regions 570 would normally be doped with phosphorus or arsenic, and the epitaxial material would be silicon. For p-type transistors, the epitaxial material would preferably be silicon-germanium, to facilitate achieving the target doping levels of boron, most frequently, or possibly indium. Again, low temperature epitaxy, 500° C. to 700° C. is preferred in order to minimize the diffusion of dopants among the various regions of the transistor. The thickness of the source/drain regions 570 is greater than the thickness of the source/drain extensions 550, but its upper surface must be less than the height of the sacrificial gate 531. In order to facilitate further processing, the top surfaces of the source/drain epitaxial layer 570 may be limited to approximately half the height of the sacrificial gate 531. This epitaxial step and the subsequent thermal processes are kept to low temperatures in order to minimize diffusion that would make the junction between the relatively high doped source/drain extensions and the oppositely, lightly doped substrate less abrupt. This is important to minimizing statistical variations.

Epitaxial layers 570 may be replaced by multiple layers of epitaxial growth in order to realize alternative device characteristics. Further, the epitaxial layers 550 and 570 are not limited to silicon and silicon-germanium. Other semiconductor materials may be used in order to realize either tensile or compressive stress in the channel or other specific device characteristics. However, the requirement for low-temperature processing remains.

Subsequent to the selective epitaxial deposition of regions 570, the contact characteristics of those regions will normally be enhanced by forming a metallic silicide 575 on their upper surfaces. This silicide is normally formed by a controlled reaction with metallic titanium, chromium or nickel with the underlying silicon to form $TiSi_2$, $CrSi_2$ or NiSi. If, after patterning the sacrificial gate 531, the hard mask is retained, no silicide will form on the upper surface of 531. If the hard mask has not been retained, a silicide 576 will be grown on the sacrificial gate 531.

Figure 5F:
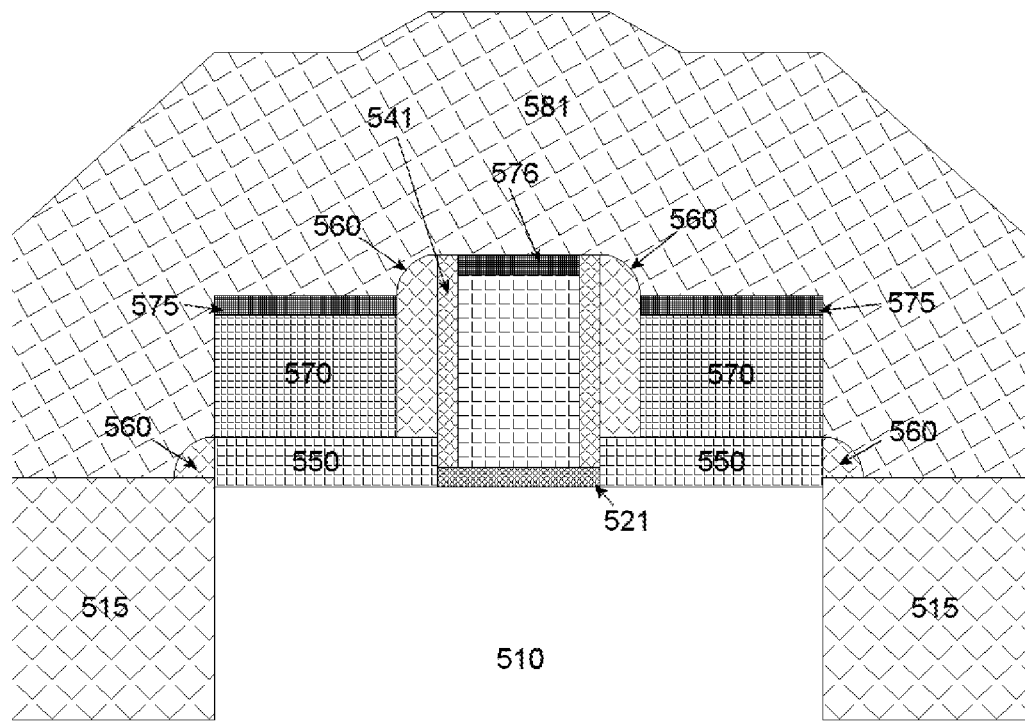
FIG. 5F is a schematic cross section of a conventional substrate with the application of a first interlayer dielectric as it may be used with an alternative embodiment.

FIG. 5F shows that, after forming the silicides 575 on the source/drain regions 570, a thick interlayer dielectric 581 is deposited on the wafer. The highest structures on the wafer at this point are the spacers 560 and the sacrificial gate 531 with or without its metal silicide 576. The total thickness of the layer 581 must exceed the elevation of those highest structures. A thickness of two to four times their height is not uncommon.

Figure 5G:
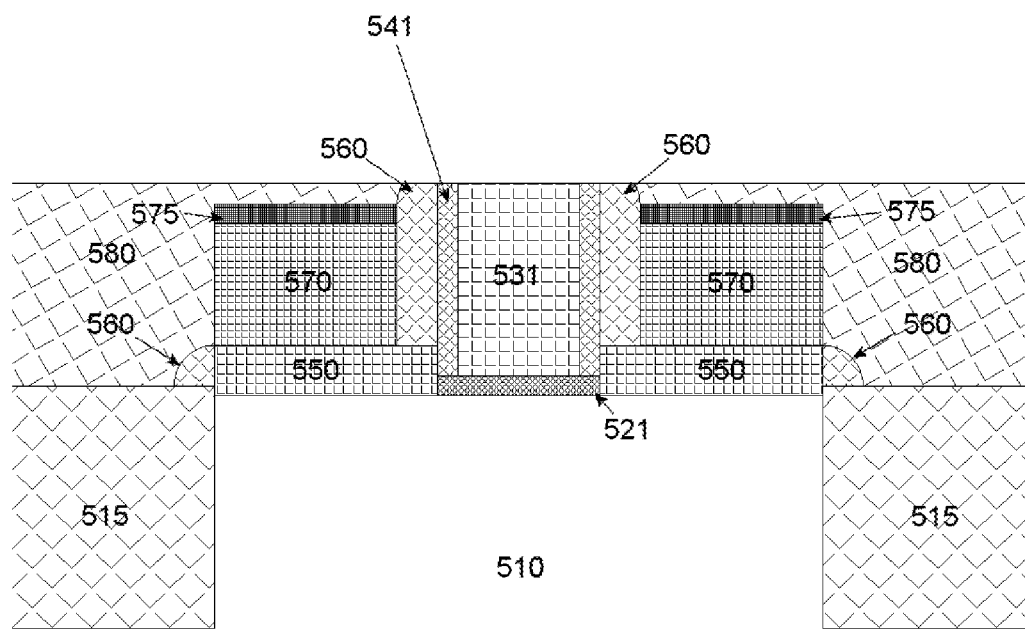
FIG. 5G is a schematic cross section of a conventional substrate after CMP to planarize the first interlayer dielectric and expose the top of the sacrificial gate as it may be used with an alternative embodiment.

As shown if FIG. 5G, the next step is the employment of chemical mechanical polishing (CMP) first to make the surface of the interlayer dielectric 580 planar, and second to remove the silicide 576 on top of the sacrificial gate 531, exposing the silicon material 531 lying beneath. The source/drain silicide layers 575 must remain protected by the interlayer dielectric 580.

Figure 5H:
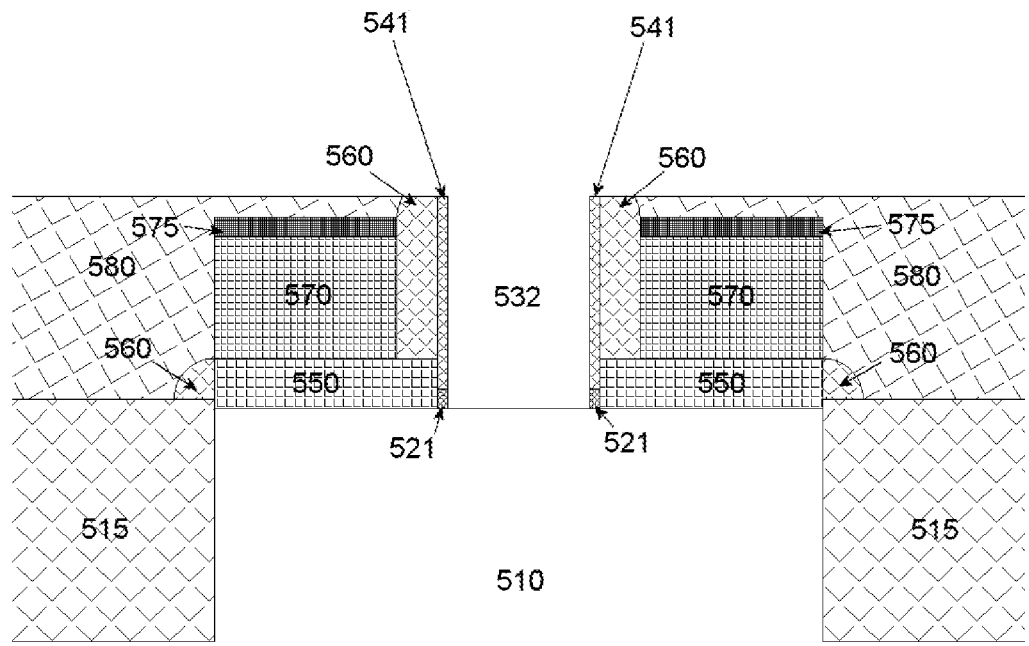
FIG. 5H is a schematic cross section of a conventional substrate showing the recess left after removing the sacrificial gate as it may be used with an alternative embodiment.

The Gate Last sequence commences, as shown in FIG. 5H, with selectively etching the sacrificial silicon gate 531, leaving the surrounding dielectrics 541, 560 and 580 intact and creating an opening 532. Through the opening 532, the screen oxide 521 is then etched to expose the underlying silicon in the channel region. Depending upon the details of the etch, some part of the screen oxide 521 may be left adjacent to the opening 532, and similarly, some of the sidewall oxide 541 may remain after the etch that clears the screen oxide 521 from the substrate 510.

Figure 5I:
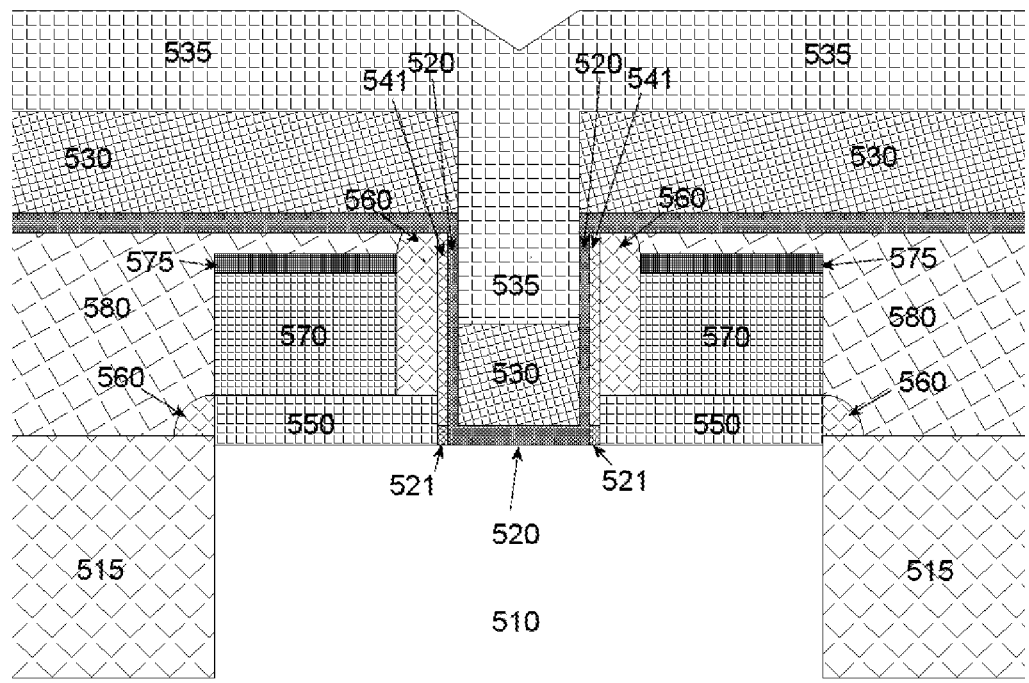
FIG. 5I is a schematic cross section of a conventional substrate with depositions of a high-K dielectric, gate metal and gate handle as it may be used with an alternative embodiment.
Figure 5J:
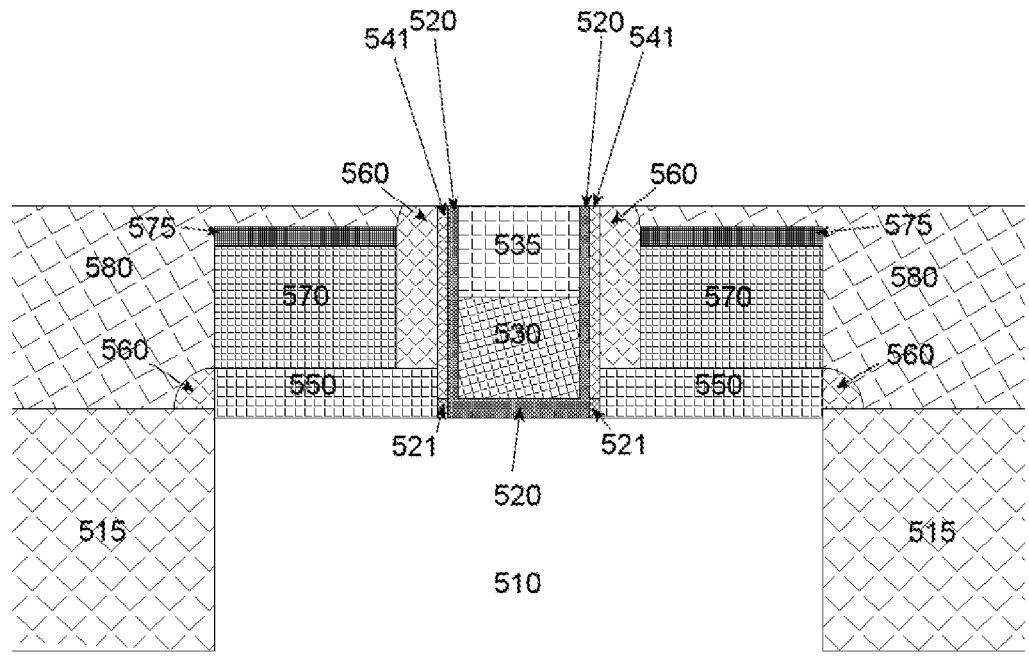
FIG. 5J is a schematic cross section of a nearly completed transistor in the alternative embodiment on a conventional substrate subsequent to CMP that clears excess gate-related depositions from the first interlayer dielectric.

FIG. 5I shows the next elements in the Gate Last sequence. The gate oxide stack 520 is deposited. This stack may be a single uniform oxide, or it could be multiple components, possibly including a $SiO_2$ transition layer adjacent the substrate 510. In most cases, the gate dielectric 520 will be dominated by a high-K material, frequently an oxide or nitride of hafnium. Depending upon the deposition process, the gate dielectric 520 may be formed on the vertical walls of the cavity 532. After the gate dielectric 520 is completed, a work-function-controlled, metallic material 530 is deposited, and on top of that a protective conductor 535, sometimes polycrystalline silicon, is deposited. The combination of dielectrics adjacent to the metallic gate 530, including the screen oxide 521, the initial sidewall oxide 541 and the gate oxide 520, need to be sufficiently thick to isolate the metallic gate 530 from the epitaxial source/drain extensions 550 for all operating voltages.

Because the deposition of metallic gate 530 and the protective conductor 535 cover the interlayer dielectric 580 with conductive materials, chemical mechanical polishing must be used to clear the added layers 520, 530 and 535 back to the interlayer dielectric 580. This is shown in Figure 5i.

Figure 5K:
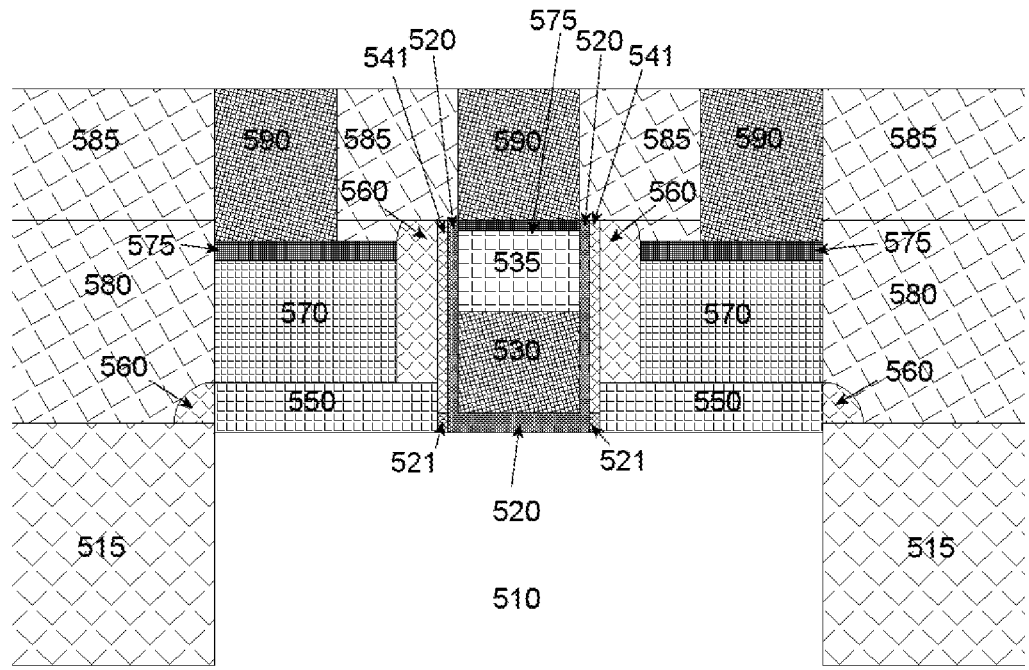
FIG. 5K is a schematic cross section of a completed transistor in the alternative embodiment, with a second interlayer dielectric and metallic contact structures for the source, drain and gate.

FIG. 5K shows the finished transistor, including a possible silicide layer 575 over the protective conductor 535. The interlayer dielectric 580 is covered by a second interlayer dielectric 585, and the transistor is then contacted by etching apertures in the interlayer dielectrics 580 and 585. Those apertures are then filled with conducting plugs 590, typically tungsten to facilitate interconnection among all transistors occupying a specific integrated circuit.

In each of the descriptions above, the epitaxial layers for the NMOS have been described as silicon, and the epitaxial layers for PMOS have been described as silicon/germanium. The essentials of the double epitaxial source and drain transistors can be realized using any epitaxial materials capable of being doped during their growth and deposited selectively. This includes silicon, of course, but it also includes silicon-germanium and silicon/carbon. Certain III-V compounds may also prove to be advantageous components of these transistors.

CMOS Processing

The principles described in the two embodiments described above may be combined in order to create integrated circuits having different classes of transistors. For instance, a high-performance processing chip may use the Gate Last sequence to create high-K, metal gate transistors that operate at a low voltage, 1 volt or below, but the input and output transistors, operating at 1.5 volts or higher, would employ the simpler polycrystalline silicon gated transistors. The principles of the double epitaxy sources and drains would normally be employed in a complementary manner to form CMOS integrated circuits. Further, the described transistor structure is agnostic with respect to the particular class of substrate employed. While bulk substrates have been used in the illustrative descriptions, the transistor is consistent with all forms of silicon-on-insulator substrates. It is also consistent with transistors using lightly doped or zero doped epitaxial channel layers, independent of the doping profiles beneath that layer.

The embodiments of the invention as described above are exemplary and should not be considered as limiting. A practitioner of the art will be able to understand and modify the invention to include other steps and process details that can influence the characteristics of the devices and tailor them to specific purposes while retaining the concepts and teachings of the invention. Accordingly, the invention should only be limited by the Claims included herewith.

What is claimed is:

1. A field effect transistor, the field effect transistor comprising:
   a semiconductor substrate including a semiconductor surface and having doping of a first type, wherein the first type is either n-type or p-type;
   a gate structure having a gate dielectric on the semiconductor surface and a conductive gate electrode on the gate dielectric, the conductive gate electrode having a uniform width same as a width of the gate dielectric, wherein the gate structure separates a source region and a drain region on the semiconductor surface;
   an epitaxial source extension having uniform doping of a second type opposite to the first type, the epitaxial source extension being on, but not penetrating, the semiconductor surface and abutting a first protective dielectric at a first side of the gate structure, wherein the first protective dielectric separates and insulates the epitaxial source extension from the conductive gate electrode, such that no portion of the epitaxial source extension lies in a projected area between the conductive gate electrode and the semiconductor substrate;
   an epitaxial drain extension having uniform doping of the second type opposite to the first type, the epitaxial drain extension being on, but not penetrating, the semiconductor surface and abutting a second protective dielectric at a second side of the gate structure opposite the first side, wherein the second protective dielectric separates and insulates the conductive gate electrode from the epitaxial drain extension, such that no portion of the epitaxial drain extension lies in the projected area between the conductive gate electrode and the semiconductor substrate;

an epitaxial source having uniform doping of the second type opposite to the first type, the epitaxial source being on the source extension and not contacting the semiconductor surface, the epitaxial source being spaced away from the first side of the gate structure by a third protective dielectric disposed on the epitaxial source extension and between the epitaxial source and the first protective dielectric;

an epitaxial drain having uniform doping of the second type opposite to the first type, the epitaxial drain being on the drain extension and not contacting the semiconductor surface, the epitaxial drain being spaced away from the second side of the gate structure by a fourth protective dielectric disposed on the epitaxial drain extension and between the second protective dielectric and the epitaxial drain;

wherein both the epitaxial source on the epitaxial source extension and the epitaxial drain on the epitaxial drain extension are non-contacting with a shallow trench isolation of the field effect transistor;

wherein thickness of the first protective dielectric and thickness of the second protective dielectric are in a range of 1 to 3 times gate oxide thickness to avoid a potential barrier between the gate structure and the epitaxial source/drain and to isolate the conductive gate electrode from the epitaxial source/drain extension for all operating voltages of the field effect transistor;

wherein the third and fourth protective dielectrics are respectively thicker than each of the first and second protective dielectrics to minimize parasitic capacitance due to capacitive coupling from the epitaxial source and the epitaxial drain to the conductive gate electrode of the gate structure;

wherein none of the dopants of the epitaxial source, the epitaxial source extension, the epitaxial drain or the epitaxial drain extension extend below the surface of the semiconductor having the doping of the first type; and wherein, by eliminating dopant of the second type from the epitaxial source, the epitaxial source extension, the epitaxial drain and the epitaxial drain extension from extending below the surface of the semiconductor having the dopant of the first type, the field effect transistor eliminates threshold variation due to random dopant distribution, reduces short channel effects and mitigates electrostatic coupling between a drain and a channel of the field effect transistor.

2. The field effect transistor of claim 1 wherein the semiconductor substrate is one chosen from a group comprising a silicon on insulator (SOI), and bulk semiconductor substrates.

3. The field effect transistor of claim 1 wherein the doped epitaxial source on the epitaxial source extension and the doped epitaxial drain on the epitaxial drain extension have doping densities in the range of $5\times10^{20}$ to $1\times10^{21}$ doping ions per cm$^3$ of the second type.

4. The field effect transistor of claim 1 wherein the doped epitaxial source extension and the doped epitaxial drain extension on the semiconductor surface have doping densities in the range of $1\times10^{20}$ to $5\times10^{20}$ doping ions per cm$^3$ of the second type.

5. The field effect transistor of claim 1 wherein the semiconductor substrate has a doping density in the range of $1\times10^{17}$ to $5\times10^{18}$ atoms per cm$^3$.

6. The field effect transistor of claim 1, wherein the conductive gate material comprises a work-function-controlled metal.

7. The field effect transistor of claim 1, wherein the epitaxial source and drain extensions have a uniform doping density of the second type opposite the first type.

8. The field effect transistor of claim 1, wherein the epitaxial source and drain extensions have a doping density between $1\times10^{20}$ to $5\times10^{20}$ ions per cm$^3$ of the second type opposite the first type.

9. The field effect transistor of claim 1, wherein the source and drain have a uniform doping density of the second type opposite the first type.

10. The field effect transistor of claim 1, wherein the source and drain have a doping density between $5\times10^{20}$ to $1\times10^{21}$ ions per cm$^3$ of the second type opposite the first type.

11. A field effect transistor comprising:

a semiconductor substrate doped to have conductivity of a first conductivity type, the first conductivity type being either n-type or p-type, the semiconductor substrate having a planar semiconductor surface, with a source region, a gate region and a drain region on the planar semiconductor surface, the source region being on one side of the gate region and the drain region being on the opposite side of the gate region;

the source region having a first epitaxial layer on the planar semiconductor surface, the first epitaxial layer being doped to have a second conductivity type opposite to the first conductivity type, and a second epitaxial layer deposited on the first epitaxial layer and not contacting the semiconductor substrate, the second epitaxial layer being doped to have the second conductivity type opposite to the first conductivity type, the second epitaxial layer being more heavily doped than the first epitaxial layer, and a first contact layer on the second epitaxial layer;

the gate region having a gate dielectric layer on the planar semiconductor surface, a conductive gate layer on the gate dielectric layer and a contact layer on the conductive gate layer, the conductive gate layer having a uniform width same as a width of the gate dielectric layer;

the drain region having a third epitaxial layer on the planar semiconductor surface, the third epitaxial layer being doped to have the second conductivity type opposite to the first conductivity type, and a fourth epitaxial layer deposited on the third epitaxial layer and not contacting the semiconductor substrate, the fourth epitaxial layer being doped to have the second conductivity type opposite to the first conductivity type, the fourth epitaxial layer being more heavily doped than the third epitaxial layer, and a second contact layer on the fourth epitaxial layer;

the conductive gate layer being separated from the first and third epitaxial layers by first and second dielectric layers, respectively, and the conductive gate layer being separated from the second and fourth epitaxial layers and the first and second contact layers by third and fourth dielectric layers, the first and second dielectric layers having layer thickness in a range of 1 to 3 times gate oxide thickness to avoid a potential barrier between the gate region and the source/drain region and to isolate the conductive gate layer from the first/third epitaxial layer for all operating voltages of the field effect transistor, the third and fourth dielectric layers being thicker than the first and second dielectric layers, respectively, to minimize parasitic capacitance due to capacitive coupling from the second epitaxial layer and the fourth epitaxial layer to the conductive gate layer of the gate region, the third dielectric layer being disposed on the first epitaxial layer and between the second epitaxial layer and first dielectric layer, the fourth dielectric layer being disposed on the third epitaxial layer and between the second dielectric layer and the fourth epitaxial layer;

wherein no portion of the first epitaxial layer and no portion of the third epitaxial layer lie in a projected area between the conductive gate electrode and the semiconductor substrate;

wherein both the second epitaxial layer and the fourth epitaxial layer on the first and third epitaxial layers, respectively, are non-contacting with a shallow trench isolation of the field effect transistor;

wherein the interfaces between the planar semiconductor substrate and the first and third epitaxial layers and between the planar semiconductor substrate and the gate dielectric layer all being coplanar with no penetration of dopants having a conductivity of the second conductivity type through the interfaces with the first and third epitaxial layers and into the substrate; and wherein having the interfaces between the planar semiconductor substrate and the first and third epitaxial layers and between the planar semiconductor substrate and the gate dielectric layer coplanar with no penetration of dopant of the second conductivity type into the substrate eliminates threshold variation due to random dopant distribution, reduces short channel effects and mitigates electrostatic coupling between a drain and a channel of the field effect transistor.

12. The field effect transistor of claim 11 wherein the first and third epitaxial layers have doping densities in the range of $1 \times 10^{20}$ to $5 \times 10^{20}$ doping ions per $cm^3$ of the second conductivity type.

13. The field effect transistor of claim 11 wherein the second and fourth epitaxial layers have doping densities in the range of $5 \times 10^{20}$ to $1 \times 10^{21}$ doping ions per $cm^3$ of the second conductivity type.

14. The field effect transistor of claim 11 wherein the semiconductor substrate has a doping density in the range of $1 \times 10^{17}$ to $5 \times 10^{18}$ atoms per $cm^3$ of the first conductivity type.

15. The field effect transistor of claim 11, wherein the conductive gate material comprises a work-function-controlled metal.

* * * * *